(12) United States Patent
D'Andrade

(10) Patent No.: US 8,476,822 B2
(45) Date of Patent: Jul. 2, 2013

(54) SATURATED COLOR ORGANIC LIGHT EMITTING DEVICES

(75) Inventor: Brian D'Andrade, Westampton, NJ (US)

(73) Assignee: Universal Display Corporation, Ewing, NJ (US)

( * ) Notice: Subject to any disclaimer, the term of this patent is extended or adjusted under 35 U.S.C. 154(b) by 11 days.

(21) Appl. No.: 12/257,648

(22) Filed: Oct. 24, 2008

(65) Prior Publication Data

US 2009/0121621 A1    May 14, 2009

Related U.S. Application Data

(60) Provisional application No. 60/986,711, filed on Nov. 9, 2007.

(51) Int. Cl.
*H01L 51/52* (2006.01)
(52) U.S. Cl.
USPC ............................... 313/504; 313/506
(58) Field of Classification Search
USPC ............... 257/40, 72, 98–100, 642–643, 759; 313/498–512, 110–117; 315/169.1, 169.3; 427/58, 64, 66, 532–535, 539; 428/690–691, 428/917; 438/26–29, 34, 82; 445/24–25
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |

(Continued)

FOREIGN PATENT DOCUMENTS

| | | |
|---|---|---|
| EP | 1154676 | 11/2001 |
| EP | 1450419 | 8/2004 |
| WO | WO 2007/095118 | 8/2007 |
| WO | WO 2008/156879 | 12/2008 |

OTHER PUBLICATIONS

The International Search Report and Written Opinion corresponding to the PCT/US2008/082647 application dated Jul. 6, 2009.

(Continued)

*Primary Examiner* — Nimeshkumar Patel
*Assistant Examiner* — Donald Raleigh
(74) *Attorney, Agent, or Firm* — Kilpatrick Townsend & Stockton, LLP

(57) ABSTRACT

An organic light emitting device is provided. The device has a first electrode, a second electrode, and an emissive layer disposed between the first and second electrodes. The emissive layer includes an emissive material with an intrinsic emission spectrum having a peak emission wavelength in the visible spectrum less than 500 nm. The device includes a color saturation enhancement layer in direct contact with the first electrode. The color saturation enhancement layer consists essentially of one or more metals or conductive doped inorganic semiconductors, and has an index of refraction at least 0.2 different from that of the organic layers. The color saturation enhancement layer has a thickness of 1-10 nm. The reflectivity of the color saturation enhancement layer is in the range 5% to 30% for the peak wavelength in the intrinsic emission spectrum of the emissive material. Preferably, the color saturation enhancement layer is disposed between the first and second electrodes.

19 Claims, 28 Drawing Sheets

U.S. PATENT DOCUMENTS

| | | | |
|---|---|---|---|
| 5,844,363 | A | 12/1998 | Gu et al. |
| 5,932,895 | A | 8/1999 | Shen et al. |
| 5,949,187 | A | 9/1999 | Xu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,133,692 | A | 10/2000 | Xu et al. |
| 6,294,398 | B1 | 9/2001 | Kim et al. |
| 6,303,238 | B1 | 10/2001 | Thompson et al. |
| 6,326,224 | B1 | 12/2001 | Xu et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 2001/0030507 | A1* | 10/2001 | Ono ........................... 313/504 |
| 2001/0033135 | A1* | 10/2001 | Duggal et al. ............... 313/506 |
| 2003/0230980 | A1 | 12/2003 | Forrest et al. |
| 2004/0080276 | A1* | 4/2004 | Ito .............................. 315/169.1 |
| 2004/0124766 | A1* | 7/2004 | Nakagawa et al. .......... 313/504 |
| 2004/0174116 | A1 | 9/2004 | Lu et al. |
| 2004/0209119 | A1* | 10/2004 | Seo et al. ..................... 428/690 |
| 2004/0241493 | A1* | 12/2004 | Inoue et al. .................. 428/690 |
| 2005/0007015 | A1* | 1/2005 | Yokoyama et al. .......... 313/506 |
| 2005/0221117 | A1* | 10/2005 | Yamada et al. .............. 428/690 |
| 2006/0006792 | A1 | 1/2006 | Strip |
| 2006/0134459 | A1* | 6/2006 | Huo et al. .................... 428/690 |
| 2006/0255727 | A1* | 11/2006 | Nee .............................. 313/506 |
| 2007/0003789 | A1 | 1/2007 | Kwong et al. |
| 2007/0069641 | A1* | 3/2007 | Hasegawa et al. ........... 313/504 |
| 2007/0075631 | A1 | 4/2007 | Tung et al. |
| 2007/0190359 | A1 | 8/2007 | Knowles et al. |
| 2008/0152946 | A1* | 6/2008 | Yen et al. ..................... 428/690 |
| 2008/0315220 | A1* | 12/2008 | Lee et al. ...................... 257/94 |
| 2009/0096352 | A1* | 4/2009 | Spindler et al. .............. 313/504 |

OTHER PUBLICATIONS

The International Search Report and Written Opinion corresponding to the PCT/US2008/082328 application dated Mar. 10, 2009.

Hobson P. A. et al., "Surface plasmon mediated emission from organic light-emitting diodes" Advanced Materials, Wiley VCH, Weinheim, Germany, vol. 14, No. 19, Oct. 2002, pp. 1393-1396.

Baldo et al., "Highly Efficient Phosphorescent Emission from Organic Electroluminescent Devices," Nature, vol. 395, 151-154, 1998; ("Baldo-I").

Baldo et al., "Very high-efficiency green organic light-emitting devices based on electrophosphorescence," Appl. Phys. Lett., vol. 75, No. 3, 4-6 (1999) ("Baldo-II").

Peng et al., "Efficient organic light-emitting diode using semitransparent silver as anode" Applied Physics Letters 87, 173505, p. 1-3 (2005).

Clymer et al. "Characterization of thin-metal anode buffers in organic devices" Microwave and Optical Technology Letters, vol. 48, No. 10, Oct. 2006, pp. 2070-2072.

Peng et al. "Efficiency improvement of phosphorescent organic light-emitting diodes using semitransparent Ag as anode" Applied Physics Letters, vol. 88, No. 3, 2006. p. 1-3; 033509.

Lin Ke; Burden et al., "Au-ITO Anode for efficient polymer light-emitting device operation" IEEE Photonics Technology Letters, vol. 17, No. 3, Mar. 2005, pp. 543-545.

Moon Jong-Min et al. "Enhancement of hole injection using ozone treated Ag nanodots dispersed on indium tin oxide anode for organic light emitting diodes" Applied Physics Letters, AIP, American Institute of Physics, NY, vol. 90, No. 16, Apr. 20, 2007, pp. 163516-163516, XP012094284.

U.S. Appl. No. 10/233,470, filed Sep. 4, 2002.

\* cited by examiner

SATURATED COLOR ORGANIC LIGHT EMITTING DEVICES

This application is related to U.S. Patent Application No. 60/986,711, filed Nov. 9, 2007, entitled "Stable Blue Phosphorescent Organic Light Emitting Devices", which is hereby incorporated herein by reference.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the present invention relates to an OLED having an enhancement layer.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entireties.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the structure of Formula I:

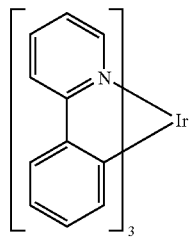

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand is referred to as "photoactive" when it is believed that the ligand contributes to the photoactive properties of an emissive material.

More details on OLEDs, and the definitions described above, can be found in U.S. Pat. No. 7,279,704, which is incorporated herein by reference in its entirety.

SUMMARY OF THE INVENTION

An organic light emitting device is provided. The device has a first electrode, a second electrode, and an emissive layer disposed between the first and second electrodes. The emissive layer includes an emissive material with an intrinsic emission spectrum having a peak emission wavelength in the visible spectrum less than 500 nm. The device includes a color saturation enhancement layer in direct contact with the first electrode. The color saturation enhancement layer consists essentially of one or more metals or conductive doped inorganic semiconductors, and has an index of refraction at least 0.2 different from that of the organic layers. The color saturation enhancement layer has a thickness of 1-10 nm. The reflectivity of the color saturation enhancement layer is in the range 5% to 30% for the peak wavelength in the intrinsic emission spectrum of the emissive material. Preferably, the color saturation enhancement layer is disposed between the first and second electrodes.

BRIEF DESCRIPTION OF THE DRAWINGS

FIG. 15 shows cross-sectional schematics of otherwise similar devices, with various thicknesses of silver over the anode.

FIG. 16 shows measured emission intensity profiles and measured plots of deviation from Lambertian emission versus viewing angle for the devices of FIG. 15.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
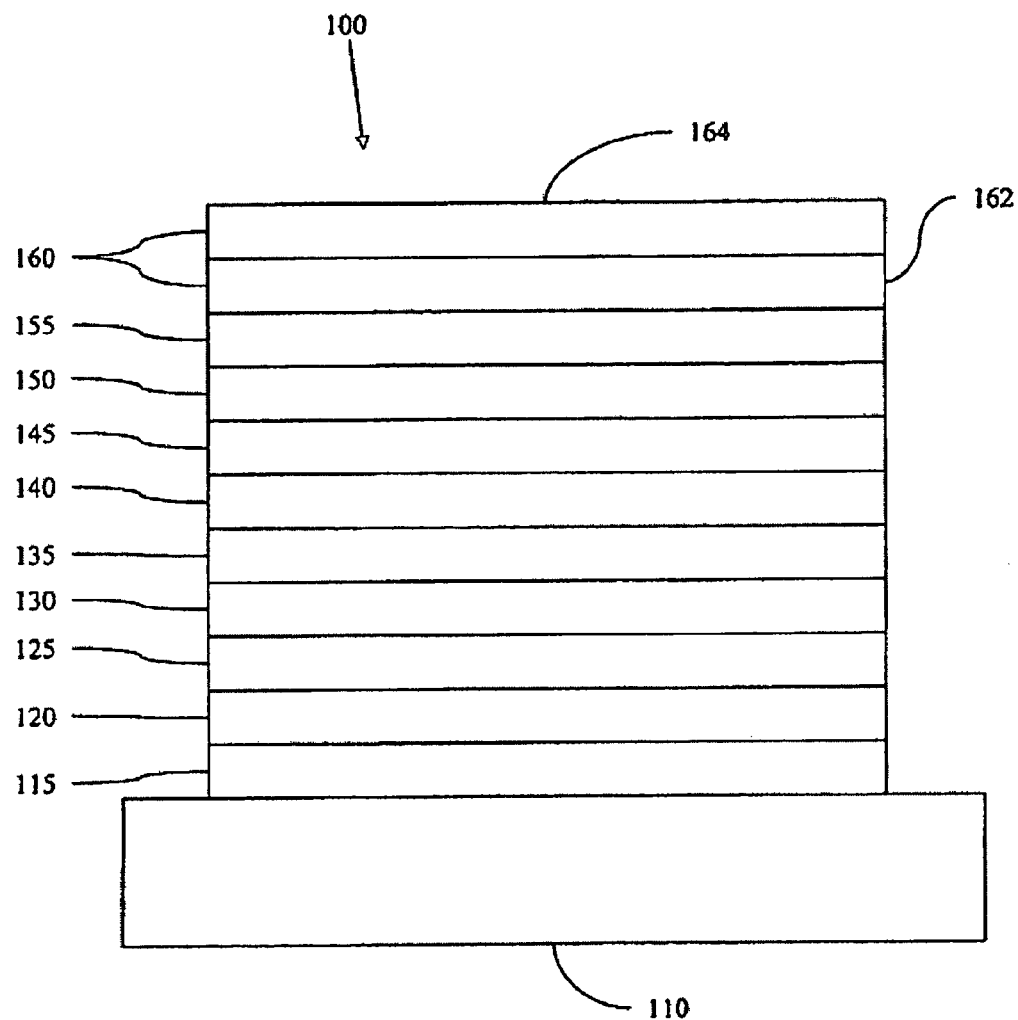
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
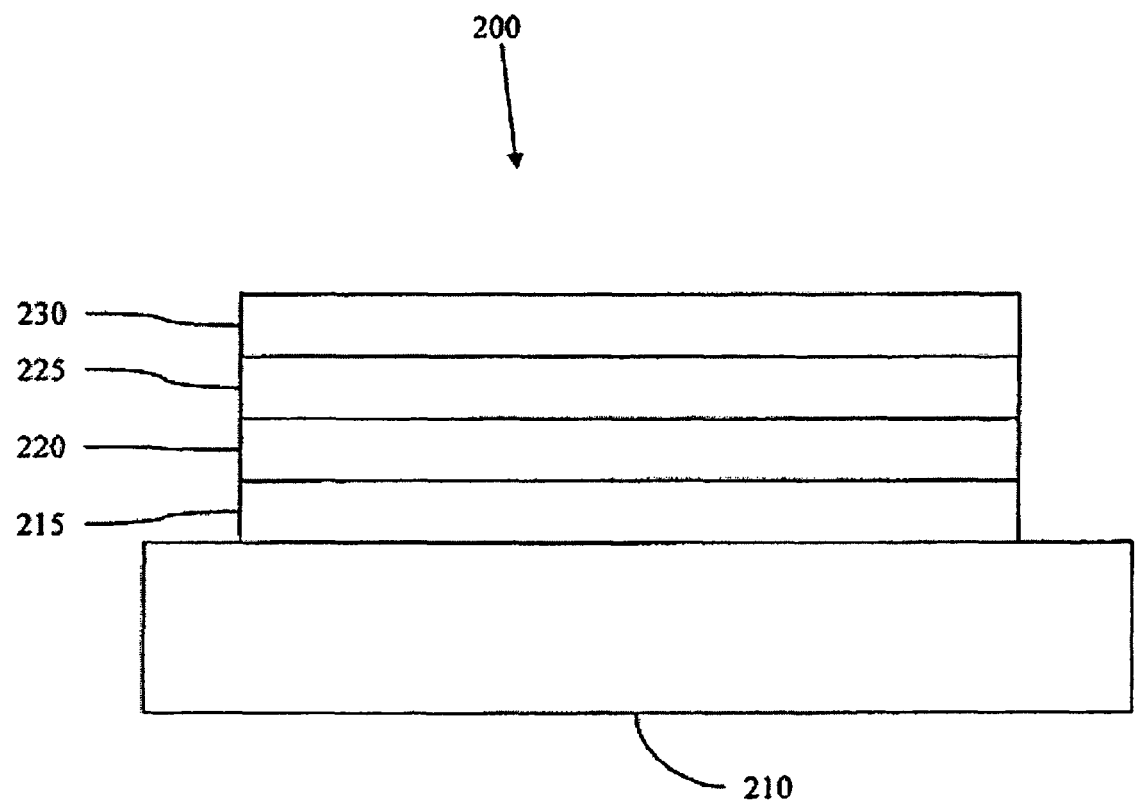
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Figure 3:
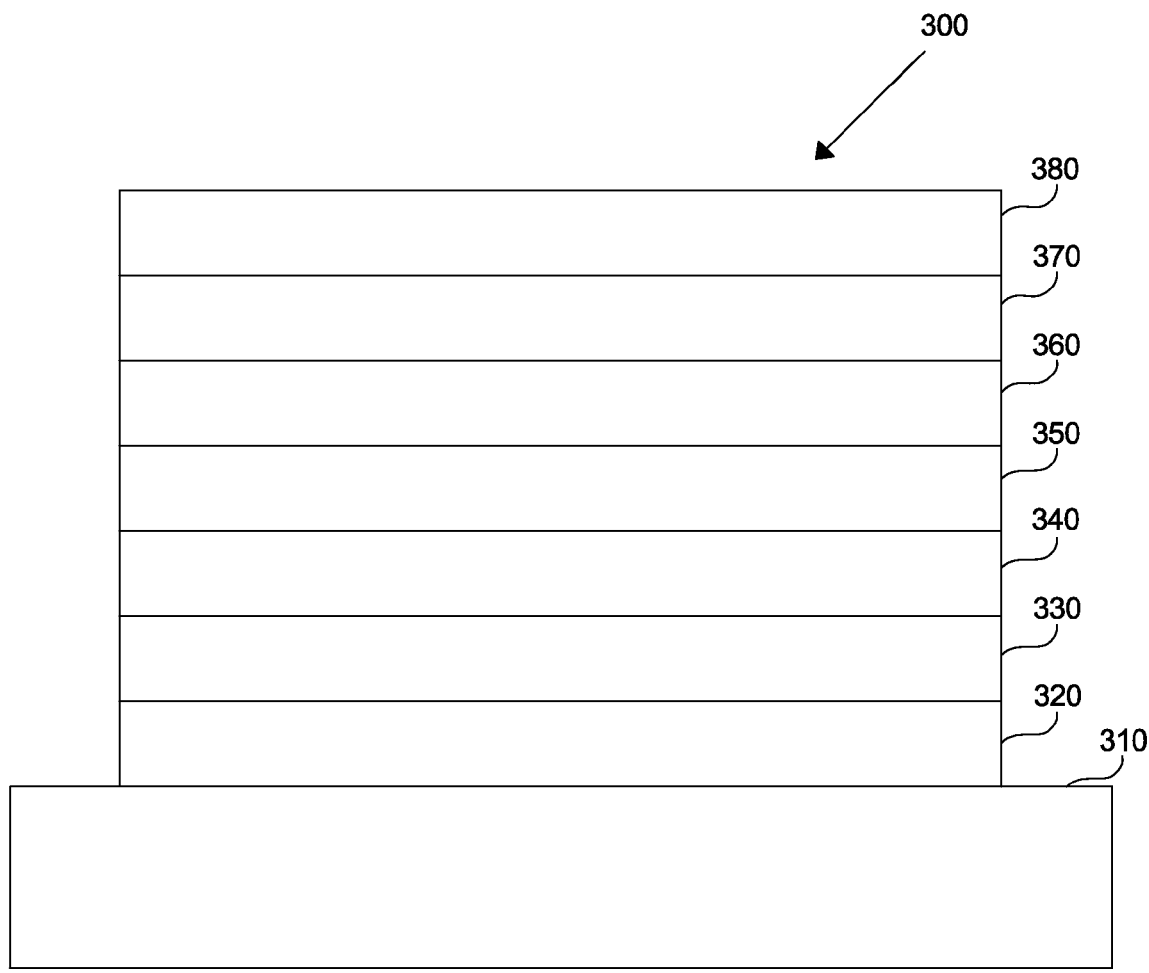
FIG. 3 shows an organic light emitting device having a color saturation enhancement layer.

FIG. 3 shows an organic light emitting device 300 that includes a color saturation enhancement layer 330. Device 300 includes a substrate 310, a first electrode 320, a color saturation enhancement layer 330, an emissive layer 340, and a second electrode 350. Device 300 may be a bottom emitting device, which emits light from emissive layer 340 through substrate 310, anode 320 and color saturation enhancement layer 330 to a viewer. A color saturation enhancement layer may be used with devices including layers in addition to those shown in device 300, many of which are described in the preceding paragraphs. Although FIG. 3 shows the color saturation enhancement layer between the first and second electrodes and in direct contact with the first electrode, it may be at other positions in the device so long as it is adjacent to an electrode through which light may pass. Transparent metallic oxides are commonly used in OLED devices as electrodes through which light may pass. The color saturation layer may be in direct contact with the first electrode (a "bottom emitting" device as illustrated in FIG. 3) or the second electrode (a "top emitting" device as illustrated in FIG. 3), and the color saturation enhancement layer may be between the electrodes or not between the electrodes. The specificity with which the positions of the "first" and "second" electrodes are described in the device in this paragraph is not intended to limit those terms as used in the claims, unless specifically written.

Figure 4:
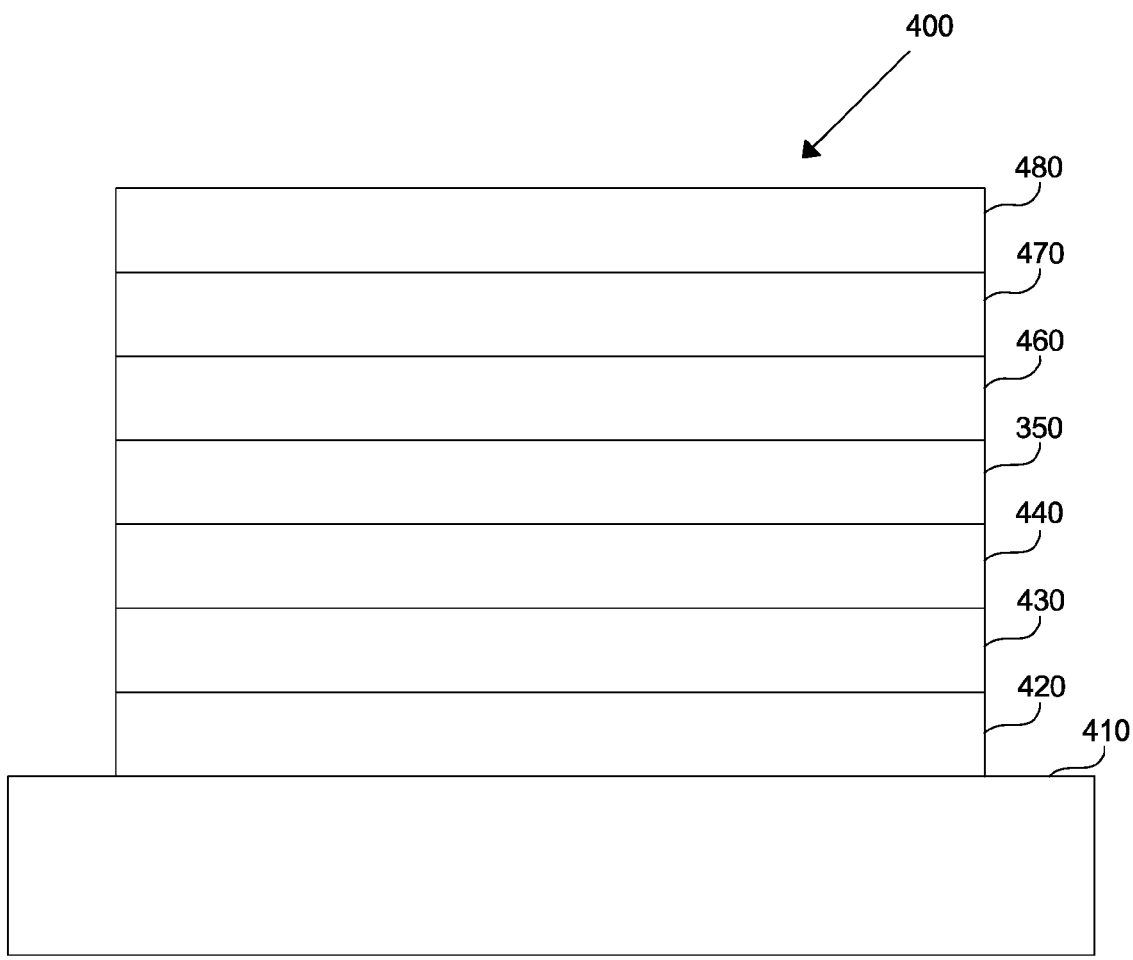
FIG. 4 shows an organic light emitting device having a color saturation enhancement layer.

FIG. 4 illustrated a preferred configuration. Device 400 includes a substrate 410, a first electrode 420, a color saturation enhancement layer 430, a hole injection layer 440, an emissive layer 450, a hole blocking layer 460, an electron transport layer 470, and a second electrode 480. First electrode 420 is an anode and second electrode 480 is a cathode.

FIG. 4 shows a color saturation enhancement layer added to a common OLED configuration, i.e., a device where the anode is closer to the substrate than the cathode, and which typically emits through the substrate. However, the use of a color saturation enhancement layer may be applied to various OLED configurations, which may emit light through the anode or the cathode, and/or through the bottom electrode (i.e., the electrode disposed on the substrate) or the top electrode.

Alternatively, the color saturation enhancement layer of FIGS. 3 and 4 may be sufficiently conductive to act as an electrode. In this case, a first electrode separate from the color saturation enhancement layer may not be needed, but may still be present. The layer illustrated as first electrode 320 in FIG. 3, or first electrode 420 in FIG. 4, may be a transparent metallic oxide, either conductive or non-conductive. Tantalum oxide and tungsten oxide are examples of suitable transparent non-conductive metallic oxides. Indium tin oxide is an example of a suitable conductive metallic oxide.

Figure 5:
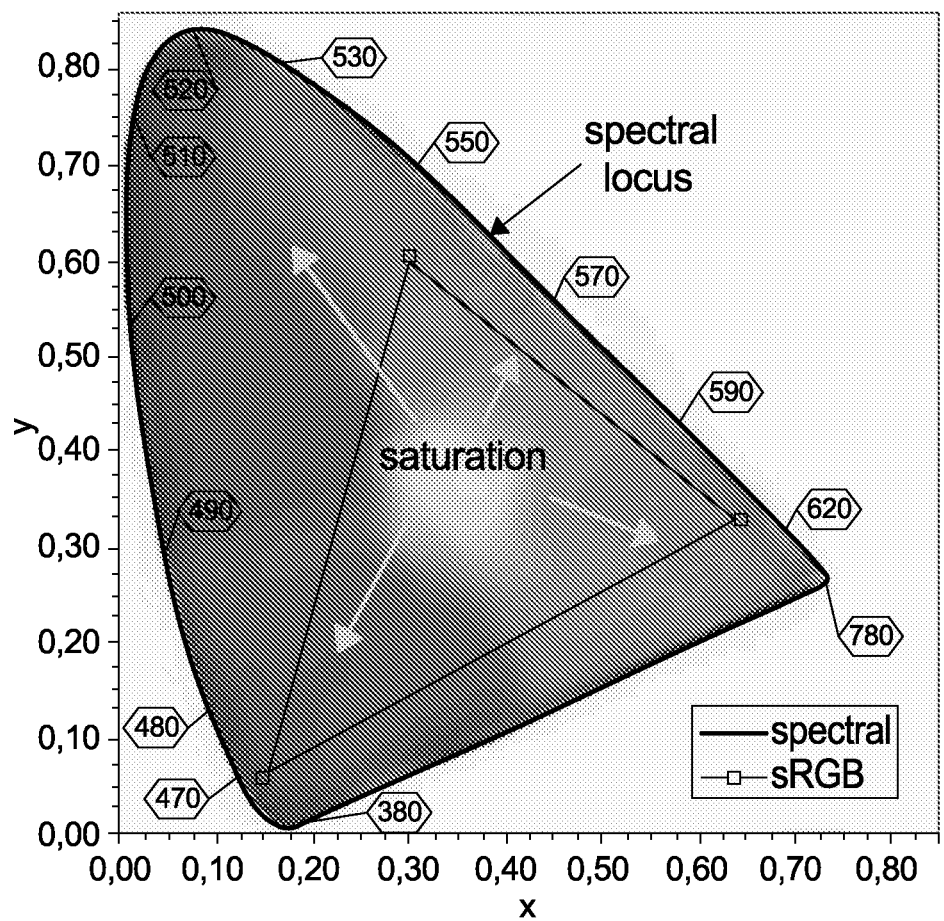
FIG. 5 shows a CIE diagram.

FIG. 5 shows a CIE diagram. This particular diagram is from 1931. The shaded area contains all CIE coordinates that describe visible light. Emission from a "single" wavelength light source has CIE coordinates that are located on the horseshoe locus. Several examples of CIE at specific wavelengths are shown. Emission having CIE coordinates close to the horseshoe locus may be said to be more saturated than emission having CIE further from the horseshoe locus. A particular emission spectrum may be made more saturated by decreasing the width of the spectrum. One measure of color saturation is the full width half maximum (FWHM) of the emission spectrum. There are specific colors that are called for by various industry standards, such as the red, green and blue for a full color display. A red, green and blue are present on the diagram as the points of the triangle, with blue being on the left, red on the right, and green on the top. A full color display using materials able to emit the specific red, green and blue at the points of the triangle could display any color inside the triangle by combining red, green and blue emission. Different industry standards may call for different specific reds, greens, blues, or other colors. One issue is that many materials have emission spectra that are less saturated than the red, green and blue desired for a full color display. Blue is particularly problematic. By using a color saturation enhancement layer, the emission from a device may be shifted relative to the intrinsic emission of the emissive material used in the device to become more saturated and move towards the blue desired by industry.

The color saturation enhancement layer is disposed between the first electrode and the second electrode, and is in direct contact with the first electrode. The material and thickness of the color saturation enhancement layer are selected to provide a "weak" reflection of the light emitted by the emissive material of the emissive layer. It is believed that a color saturation enhancement layer consisting essentially of one or more metals or highly conductive semiconductor such as p- or n-type silicon, i.e., a conductive doped inorganic semiconductor, and having a thickness of 1-10 nm, will generally provide the desired weak reflection. One of skill in the art can readily ascertain the amount of reflectivity provided by a particular layer in a device. There are also software packages that can be used to calculate optical properties of devices, such as ETFOS by Fluxim AG. Dorfstrasse 7 8835 Feusisberg, Switzerland.

By a "weak" reflection, it is meant that the color saturation enhancement layer has a reflectivity of less than 30% for the peak wavelength of the intrinsic emission spectrum of the emissive material. The color saturation enhancement layer should have a reflectivity of at least 5% reflectivity in order to have an effect on the CIE coordinates of the light emitted.

The "reflectivity" of a layer is due to differences in the indices of refraction of that layer and adjacent layers. Most light reflection occurs at the interface between layers, and the amount of light reflected at a particular interface depends on the difference in the indices of refraction. In order to provide sufficient reflectivity, the index of refraction of the color saturation enhancement layer should be at least 0.2 different from that of the adjacent organic layers. In the specific devices fabricated and modeled as described herein, the index of refraction of the color saturation enhancement layer was modeled as being lower than that of the organic layers. However, a color saturation enhancement layer having an index of refraction that is higher than that of the adjacent organic layers is also expected to cause some reflectivity, and could also be used. The difference in the indices of refraction of the materials can be quite large, up to 4.0. However, the combination of the index of refraction and the thickness of the layer should be such that the color saturation enhancement layer provides a weak reflection. Most organic materials currently used in OLEDs have an index of refraction in the range 1.5-2.3. The interface between the color saturation enhancement layer and the underlying metallic oxide layer also causes reflectivity that should be considered. Where a color saturation enhancement layer is not between the electrodes, i.e., the color saturation enhancement layer is not in contact with the organic layers, the index of refraction of the color saturation enhancement layer should be at least 0.2 different from that of the adjacent electrode.

Because reflection occurs at interfaces, one relevant comparison is that of the reflection that would occur at a device having a single interface between an organic layer and a metallic oxide layer, to the reflection that occurs in an otherwise identical device having an extra color saturation enhancement layer, with an interface between the organic layer and the color saturation enhancement layer, and another interface between the color saturation enhancement layer and the metallic oxide layer. The "weak" reflection provided by the color saturation enhancement layer means that the color saturation enhancement layer is responsible for not more than a 30% reflection of light. Thus, the additional reflection of light in a device with a color saturation enhancement layer relative to the reflection that would occur in an otherwise identical device without a color saturation enhancement layer is not more than 30%. In a conventional device structure having organic layers disposed directly over an ITO anode, it is expected that there is about 5-10% reflection at the ITO— organic interface. The color saturation enhancement layer supplements this reflectivity by adding an extra 5-30% reflectivity.

The reflectivity of a layer may be wavelength dependent. The relevant wavelength for the reflectivity of the color saturation enhancement layer is the peak wavelength of the intrinsic emission spectrum of the emissive material. The "intrinsic" emission spectrum is the emission spectrum of the material when it is not subject to any optical constraints such as the presence of a microcavity. One way to observe the intrinsic emission spectrum of a material is photoexcitation of the material in an appropriate solvent. The observed emission spectrum from a device may be significantly different from the intrinsic emission spectrum due to the presence of optical microcavities, differential absorption of different wavelengths, or other optical considerations. One purpose of the color saturation enhancement layer is to modify the emission spectrum to get emission from the device that is more saturated than the intrinsic spectrum of the emissive material, without the undesirable high angular dependency generally associated with microcavities.

One way to measure the beneficial effects of a color saturation enhancement layer is to compare the emission spectrum of a device with a color saturation enhancement layer to an otherwise identical device without a color saturation enhancement layer. By providing extra reflectivity, the color saturation enhancement layer enables the narrowing of the emission spectrum of the light emitted by the device. The full width half maximum (FWHM) of the emission spectrum is a relevant parameter. Preferably, the emission spectrum of a device having a color saturation enhancement layer is at least 5 nm narrower, more preferably at least 10 nm narrower, and most preferably at least 12 nm narrower than that of an otherwise identical device without a color saturation enhancement layer. Looking at FIG. 11, for example, the second and seventh devices in the legend are otherwise identical devices, where the second device has a 5 nm thick Ag color saturation enhancement layer, whereas the seventh device does not. The FWHM of the emission spectrum of the second device is 44 nm, while the FWHM of the seventh device is 57 nm. Both emission spectra are plotted in FIG. 11, and the emission spectrum of the seventh device is visibly wider (i.e., less "saturated") than that of the second device.

It is believed that certain metals, such as aluminum and chromium, are generally thought of as undesirable for placement in organic light emitting devices between the anode and the organic layers. See, Peng et al., Efficient organic light-emitting diode using semitransparent silver as anode, Applied Physics Letters 87, 173505, p. 1 (2005), teaching that high work function metals are desirable to lower barriers for hole injection; conversely, low work function metals are not desirable. Surprisingly, it has been found that these metals may be used as thin layers between the anode and the organic layers of an organic light emitting device as color saturation enhancement layers. A hole injection layer made of materials such as LG101 or NPD doped with F4TCNQ may be used to mitigate issues caused by the lower work functions of these metals. It is believed that band bending in the hole injection layer may be enabled when the hole injection layer is highly conductive, resulting in good hole injection that can overcome issues associated with the low work function of metals such as aluminum and chromium. Silver is also a preferred material for use as a color saturation enhancement layer. More generally, the color saturation enhancement layer may be a metal having a thickness of 1-10 nm.

Microcavities may be used to adjust the emission spectrum of an OLED. However, the use of microcavities has undesirable effects at off-center viewing angles. Generally, the intensity of light decreases significantly more in a device with a microcavity than in a device without a microcavity as the viewing angle increases from zero (i.e., normal to the substrate) to sixty degrees. In addition, the CIE coordinates of the observed light at non-zero viewing angles may be significantly shifted relative to the CIE coordinates at a zero viewing angle.

Surprisingly, the use of a weak microcavity, i.e., a microcavity where the reflection from the layers between the viewer and the emissive layers is less than usual for a microcavity, provides many of the color-shifting benefits of a microcavity while minimizing the undesirable angular dependency in intensity and CIE coordinates normally associated with microcavities.

Figure 14:
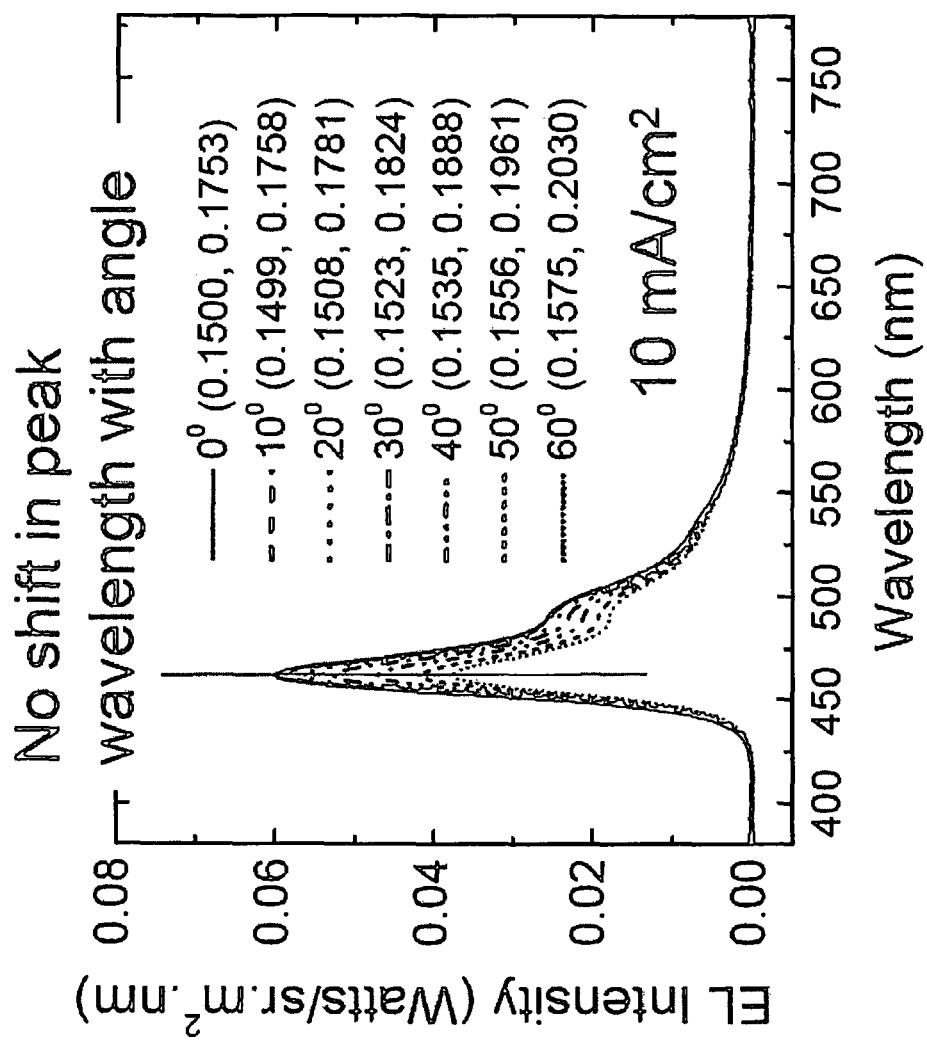
FIG. 14 shows plots of measured electroluminescent intensity versus wavelength for the device of FIG. 12.
Figure 27:
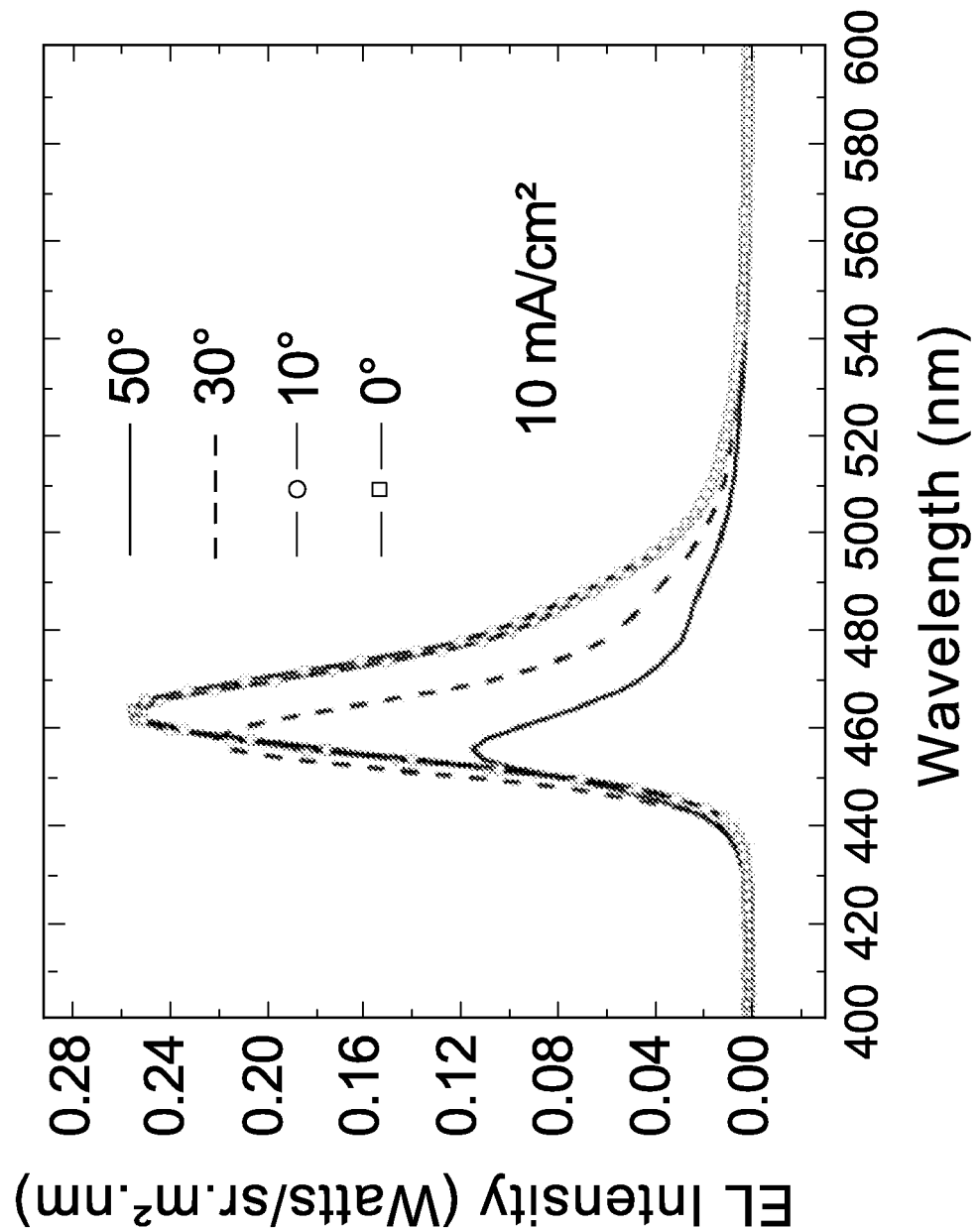
FIG. 27 shows plots of measured electroluminescent intensity versus wavelength for the device of FIG. 26 measured at various viewing angles.

A color saturation enhancement layer also unexpectedly does not result in the strong angular dependence of CIE coordinates and peak wavelength normally associated with the use of a microcavity. For example, a color saturation enhancement layer may be used to decrease the FWHM of the emission spectrum of a device from that of an otherwise identical device without a color saturation enhancement layer, yet the peak wavelength of the light emitted by the device at all angles between zero and sixty degrees does not deviate by more than 1.5% from the peak wavelength emitted at an angle of zero degrees, preferably not more than 1.0%, and more preferably not more than 0.5%. These results are illustrated, for example, in FIGS. 14 and 27. In FIG. 14, the peak wavelength of a device with a color saturation enhancement layer is 462 nm and does not measurably shift (i.e., any shift is less than 2 nm, which is the resolution of the equipment used to measure wavelength) as viewing angle changes from zero to 60 degrees. In FIG. 27, the peak wavelength of a device with a microcavity shifts from 464 nm to 456 nm as viewing angle changes from zero degrees to 60 degrees, i.e., a shift of 1.75%.

For a device with a color saturation enhancement layer, the x-coordinate of the CIE may vary by less than 0.01 and the y-coordinate of the CIE may vary by less than 0.03 between viewing angles normal to the substrate and sixty degrees from the normal to the substrate, as illustrated in FIG. 14. It is expected that the measurement of CIE shift with viewing angle from FIG. 14 will be generally applicable to color saturation enhancement layers.

Similarly, with the use of a weak microcavity, the intensity of light at various viewing angles does not drop off sharply as it does when a strong microcavity is used. This point is illustrated in FIGS. 16A and 16B. FIG. 16B shows that, for the weak cavity corresponding to the device of FIG. 15A, the deviation in intensity from Lambertian does not exceed 13% for viewing angles of 60 degrees or less. Thus, with the benefit of the present disclosure, one of skill in the art could fabricate devices having weak microcavities that do not change the intensity of light at various viewing angles by more than 20% from Lambertian, and more preferably by not more than 15%. The device with a weak microcavity has performance comparable to a standard device (i.e., the device of FIG. 15B) in terms of remaining close to Lambertian emission at various viewing angles. Thus, the color-shifting attributes of the weak microcavity may be attained without significantly adversely affecting light intensity at various viewing angles.

While a color saturation enhancement layer may be used with beneficial effect in OLEDs of various colors, the use of a color saturation enhancement layer in a blue emitting device is particularly desirable. By "blue emitting," it is meant that the intrinsic emission spectrum of the emissive material has a peak wavelength less than 500 nm. Obtaining an OLED device that emits saturated blue light, while having a host of other desirable properties such as high efficiency and long device lifetime, has posed considerable challenges. The use of a color saturation enhancement layer allows other parameters, such as the chemical composition of the emissive material, to be adjusted, and can compensate for any resultant shift in the CIE coordinates of the light emitted by the device. Depending upon the particular emissive material being used, it may be desirable to use a color saturation enhancement layer that results in a specific amount of extra saturation. For example, for a device that already emits close to saturated blue, perhaps the use of a color saturation enhancement layer to narrow the FWHM of the emission spectra of the device of only 5 nm would be desirable. For a device that emits somewhat further away from saturated blue, but perhaps as a part of a trade-off resulting in higher device stability or lifetime, the use of a color saturation enhancement layer to narrow the FWHM of the emission spectrum of the device by a larger amount, such as 10 or 12 nm, may be desirable.

A color saturation enhancement layer may also have a conductivity that is significantly larger than that of the transparent semiconductors generally used as transparent electrodes in an OLED. As a result, the use of a color saturation enhancement layer may increase lateral conductivity in the device and result in higher luminance uniformity.

FIGS. 6, 8, 12, 15, 17, 21 and 26 show cross-sectional schematics of OLEDs. The device of FIG. 17 was not actually fabricated. Rather, the parameters of the device were used to calculate the data shown in FIGS. 18 and 19.

The devices illustrated in FIGS. 6, 8, 12, 15, 21 and 26 were fabricated and measured. Unless otherwise noted, each device was fabricated as follows: Substrates coated with ITO were purchased from Nippon Sheet Glass Co. Ltd of Kanagawa-ken, Japan. All layers subsequent to the ITO were deposited by vacuum thermal evaporation (VTE).

In the Figures, COMPOUND A or "A" refers to the following compound:

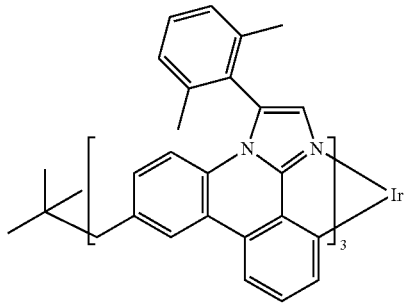

COMPOUND B or "B" refers to the following compound:

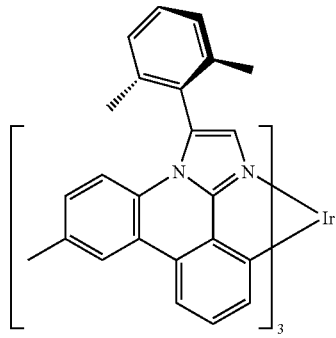

COMPOUND C or "C" refers to the following compound:

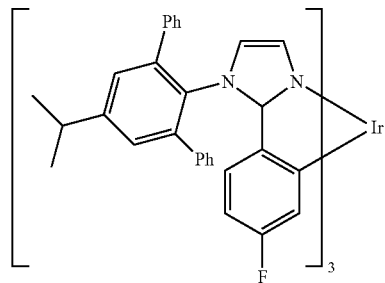

LG101™ is a product purchased from LG of Korea.

The other compounds are described using nomenclature that is well known in the art.

Figure 6:
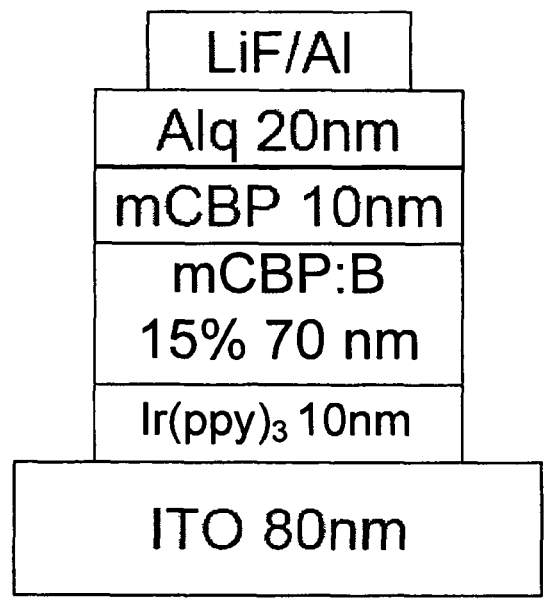
FIG. 6 shows a cross-sectional schematic of a device that does not include a color saturation enhancement layer.

FIG. 6 shows a cross-sectional schematic of a device that does not include a color saturation enhancement layer. The device of FIG. 6 includes an 80 nm thick anode of ITO, a 10 nm thick hole injection layer of Ir(ppy)3, a 70 nm thick emissive layer of mCBP doped with 15% of Compound B, a 10 nm thick hole blocking layer of mCBP, a 20 nm thick electron transport layer of Alq, and a LiF/Al cathode. The device of FIG. 6 is also the seventh device in the legend of FIG. 11, i.e., it is the device of FIG. 8 with no color saturation enhancement layer, X=20 nm, and Y=10 nm.

Figure 7:
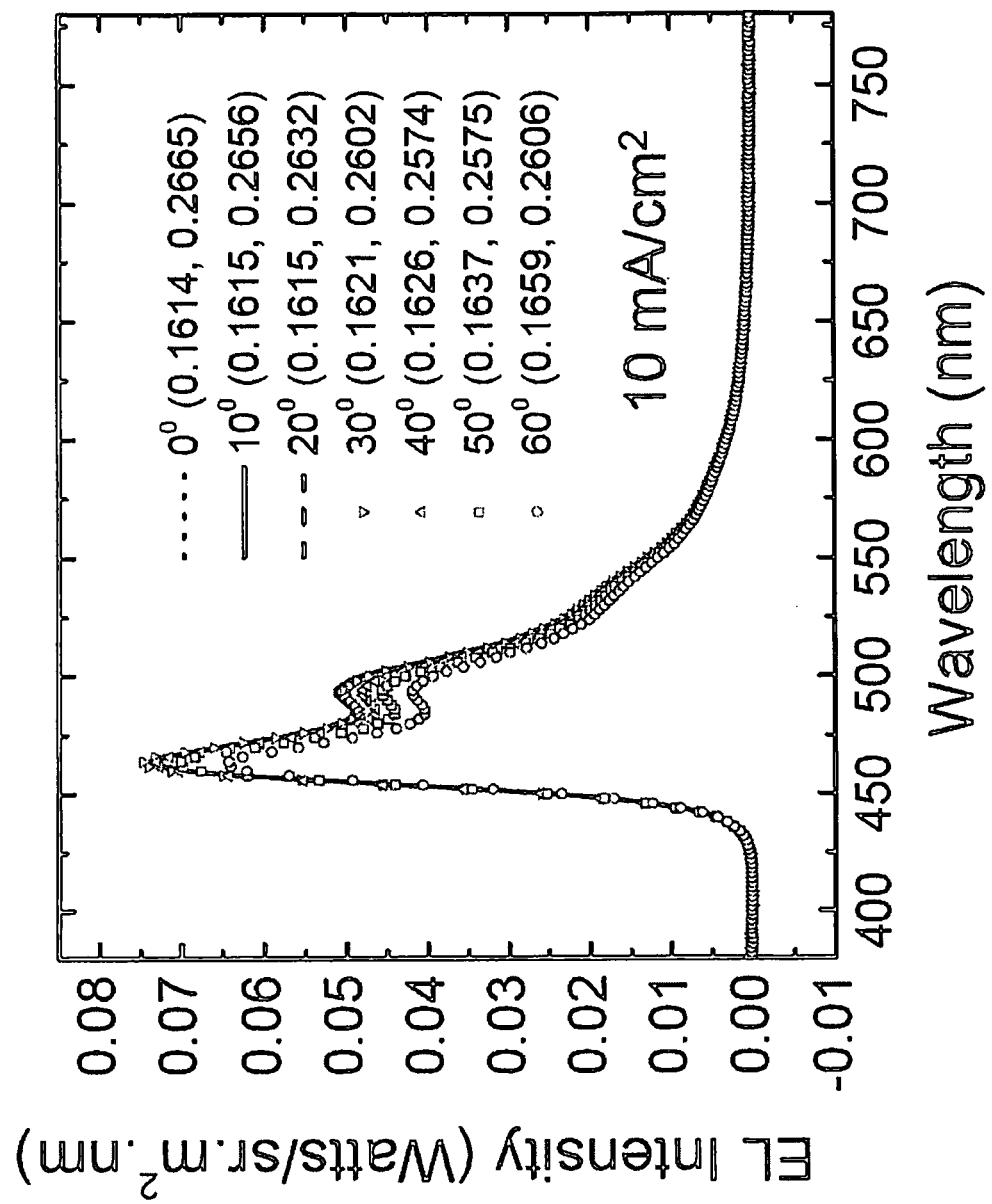
FIG. 7 shows measured electroluminescent spectra for the device of FIG. 6 at various viewing angles.

FIG. 7 shows measured electroluminescent spectra for the device of FIG. 6 at various viewing angles, when a current of 10 mA/cm² is run through the device. As can be seen in FIG. 7, the CIE coordinates of the emitted light shifts as the viewing angle increases from zero to 60 degrees.

Figure 8:
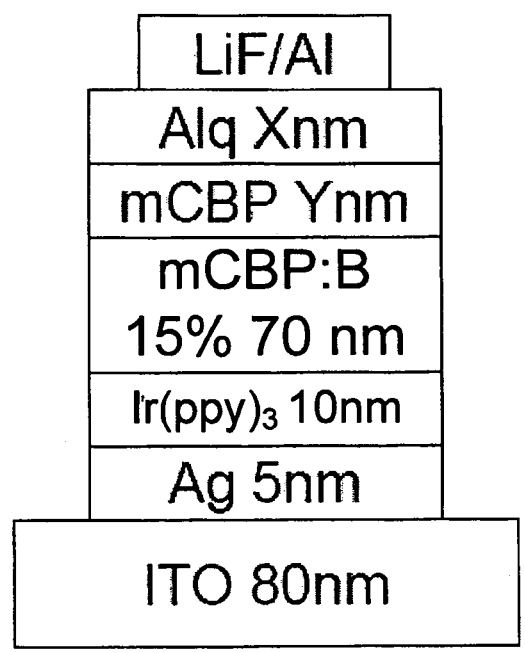
FIG. 8 shows a cross-sectional schematic of a device that includes a 5 nm thick Ag color saturation enhancement layer, and variable electron transport and blocking layer thicknesses.
Figure 11:
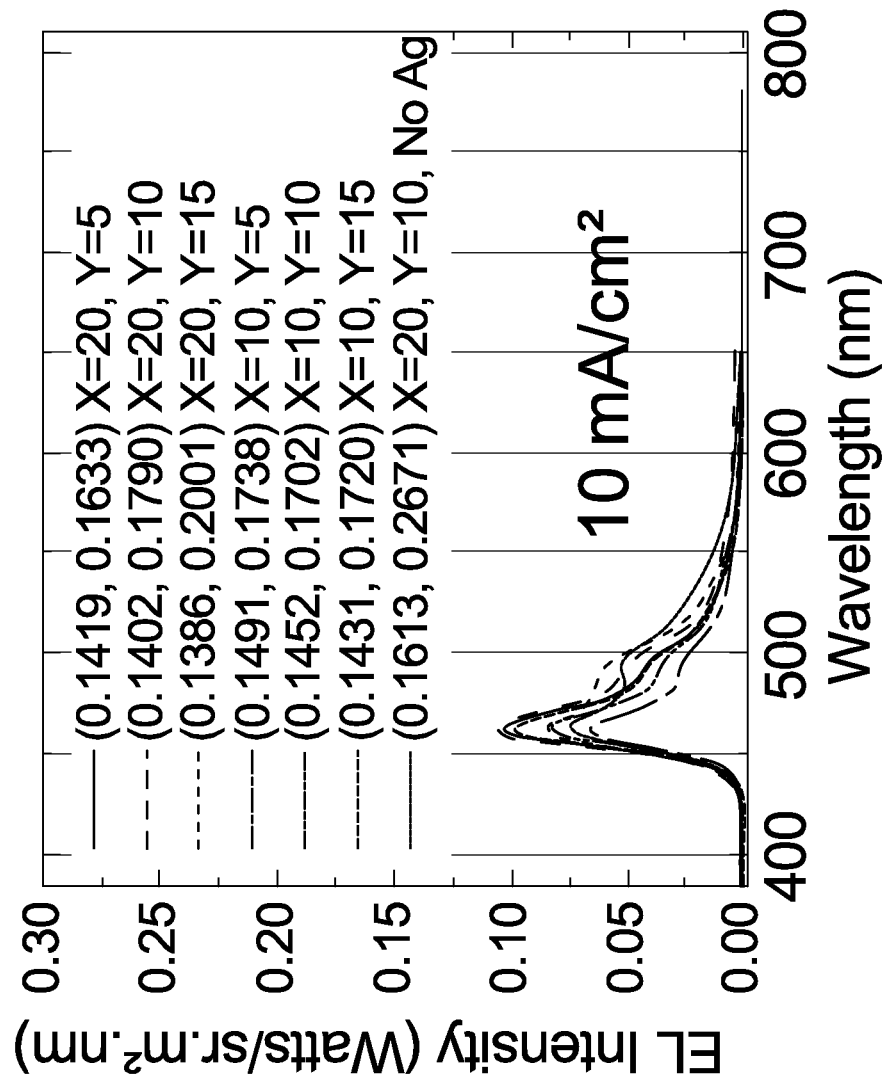
FIG. 11 shows plots of measured electroluminescence intensity versus wavelength for the device of FIG. 8.

FIG. 8 shows a cross-sectional schematic of a device that includes a 5 nm thick Ag color saturation enhancement layer, and variable electron transport and blocking layer thicknesses. The device of FIG. 8 includes a 80 nm thick anode of ITO, a 5 nm thick color saturation enhancement layer of Ag, a 10 nm thick hole injection layer of Ir(ppy)3, a 70 nm thick emissive layer of mCBP doped with 15% of Compound B, a hole blocking layer of mCBP with a variable thickness Y from 5 to 15 nm as shown in FIG. 11, an electron transport layer of Alq with a variable thickness X as shown in FIG. 11, and a LiF/Al cathode. "Variable thickness" means that multiple devices were fabricated, with specific thicknesses X and Y for the hole blocking and electron transport layers as shown in FIG. 11. One of the devices did not have a color saturation enhancement layer, again as indicted FIG. 11.

Figure 9:
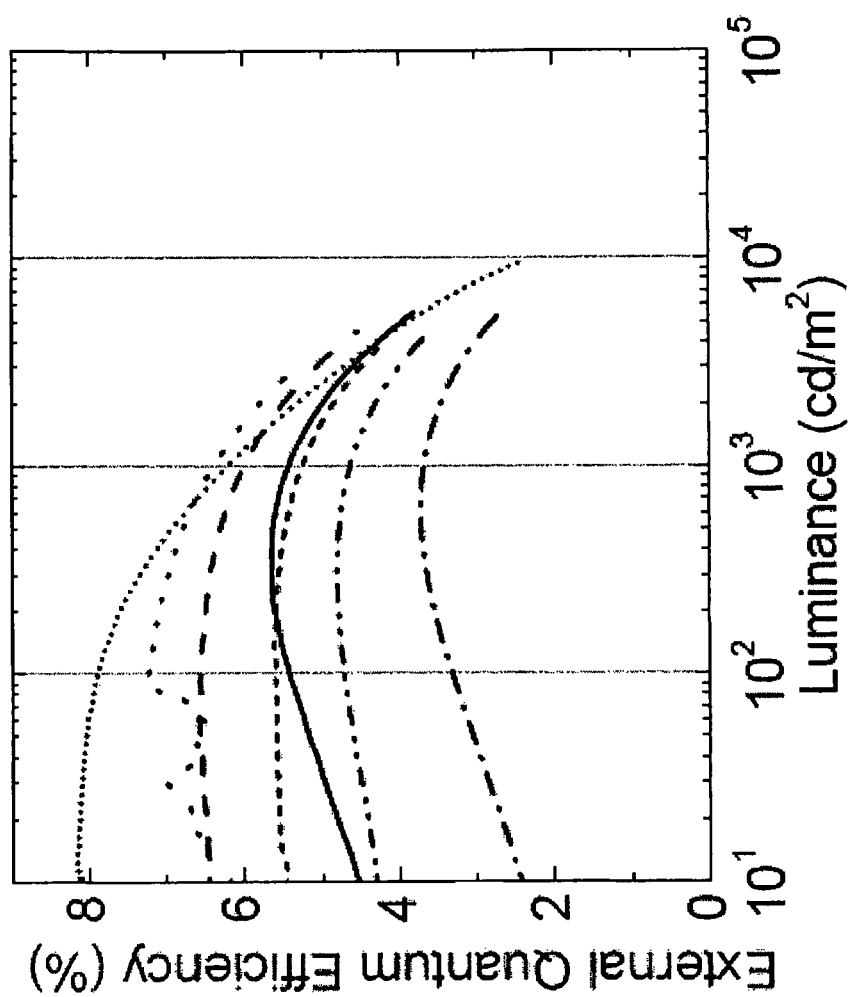
FIG. 9 shows plots of measured external quantum efficiency versus luminance for the device of FIG. 8. The legend is in FIG. 11.

FIG. 9 shows plots of measured external quantum efficiency versus luminance for the devices of FIG. 8. The legend is in FIG. 1. FIG. 9 shows that, at a luminance of 10 cd/m2, the device without a color saturation enhancement layer has the highest efficiency. However, at higher luminances, the efficiency of the devices having a color saturation enhancement layer improves relative to the device without such a layer.

Figure 10:
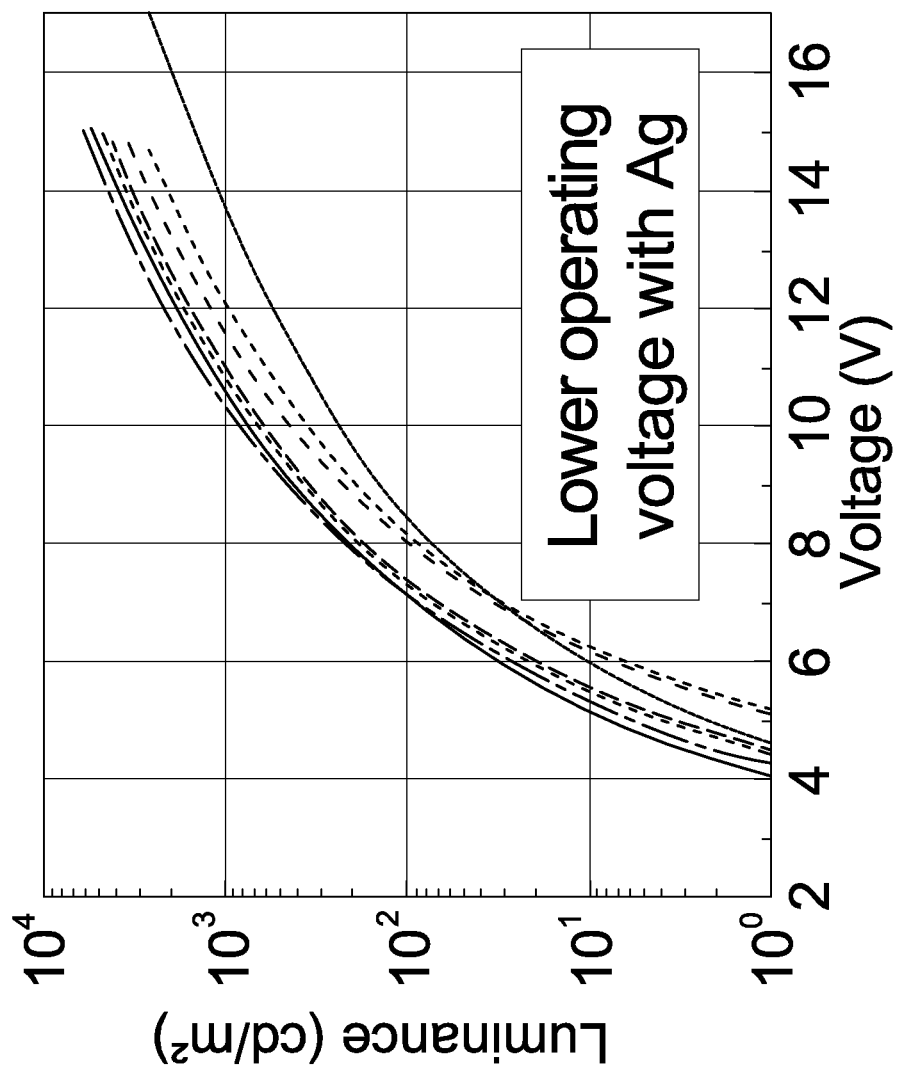
FIG. 10 shows plots of measured luminance versus voltage for the device of FIG. 8. The legend is in FIG. 11.

FIG. 10 shows plots of measured luminance versus voltage for the device of FIG. 8. The legend is in FIG. 11. FIG. 10 shows that devices having a color saturation enhancement layer have lower operating voltages than devices without such a layer. It is believed that the lower operating voltage is the result of more efficient hole injection from the Ag color saturation enhancement layer, and a resultant shift in the recombination location towards the cathode.

FIG. 11 shows plots of measured electroluminescence intensity versus wavelength for the device of FIG. 8. The CIE coordinates for each device are also shown in the legend. Comparing the device 2 to the device 7, both having X=20 and Y=10 and differing in that device 2 has an Ag color saturation enhancement layer whereas device 7 does not, it can be seen that the presence of a color saturation enhancement layer has a significant effect on the emission spectra. Specifically, device 2 is significantly blue-shifted relative to device 7.

The second device is almost identical to the seventh device from the legend of FIG. 11, except the second device has a 5 nm thick Ag color enhancement layer whereas the seventh device does not. Both devices have the structure shown in FIG. 8., with X=20 nm and Y=10 nm. The device with the color saturation enhancement layer had the following characteristics at 1000 cd/m$^2$: CIE (0.1402, 0.1790), operating voltage 10.9V, and efficiency=6%. The otherwise identical device without a color saturation enhancement layer had the following characteristics at 1000 cd/m$^2$: CIE (0.1613, 0.2671), operating voltage 13.7V, and efficiency=6.5%. Based on the measurements for the slightly different device of FIG. 14, it is expected that the x-coordinate of the CIE varies by less than 0.01 and the y-coordinate of the CIE varies by less than 0.03 between viewing angles normal to the substrate and sixty degrees from the normal to the substrate for the second device of FIG. 11. For the seventh device of FIG. 11, without a color saturation enhancement layer, the x-coordinate of the CIE varied by about 0.0045 and the y-coordinate of the CIE varied by about 0.0059 between viewing angles normal to the substrate and sixty degrees from the normal to the substrate, as illustrated in FIG. 7—the device of FIG. 6 is the device of FIG. 8 with X=20, Y=10, and no Ag layer. This increase in the change of CIE coordinate with viewing angle in a device with a color saturation enhancement layer relative to a device without such a layer is not significant.

Figure 12:
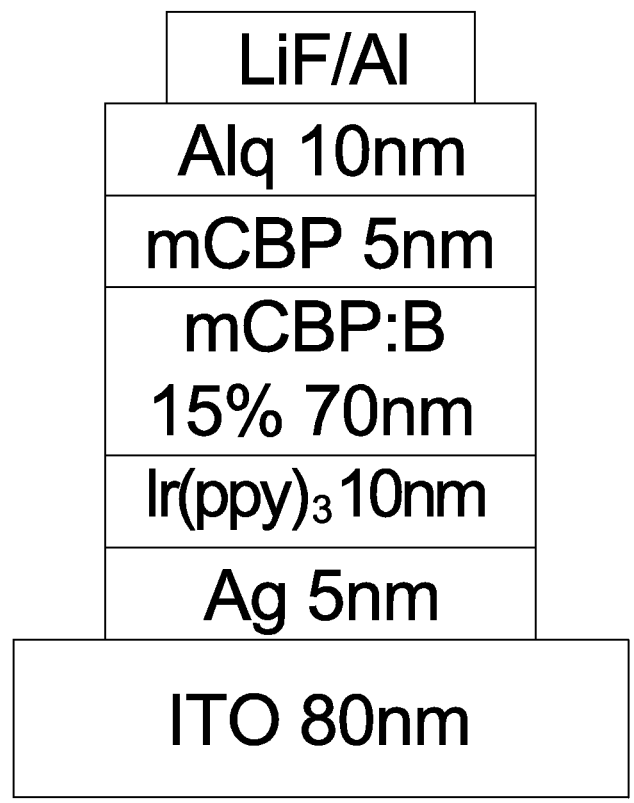
FIG. 12 shows a cross-sectional schematic of a device that includes a 5 nm thick Ag color saturation enhancement layer.

FIG. 12 shows a cross-sectional schematic of a device that includes a 5 nm thick Ag color saturation enhancement layer. The device of FIG. 12 includes a 80 nm thick anode of ITO, a 5 nm thick color saturation enhancement layer of Ag, a 10 nm thick hole injection layer of Ir(ppy)3, a 70 nm thick emissive layer of mCBP doped with 15% of Compound B, a 5 nm thick hole blocking layer of mCBP, a 10 nm thick electron transport layer of Alq, and a LiF/Al cathode.

Figure 13:
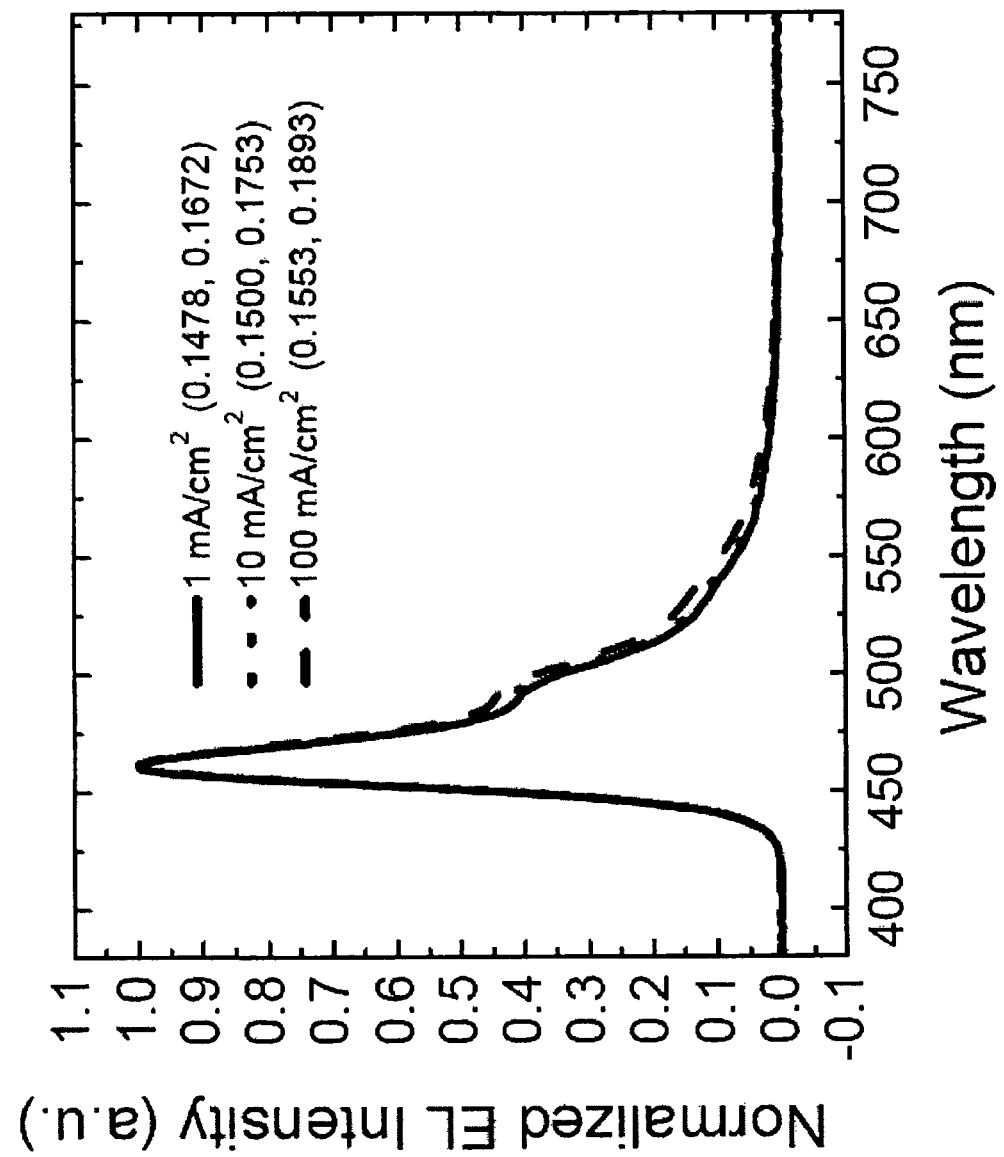
FIG. 13 shows plots of measured normalized electroluminescent intensity versus wavelength for the device of FIG. 12 at various operating currents.
Figure 17:
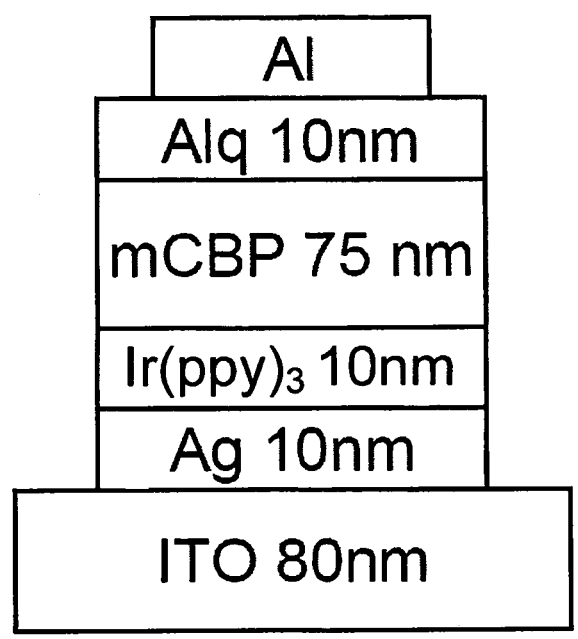
FIG. 17 shows a cross-sectional schematic of a device that includes a 10 nm thick Ag color saturation enhancement layer.
Figure 18:
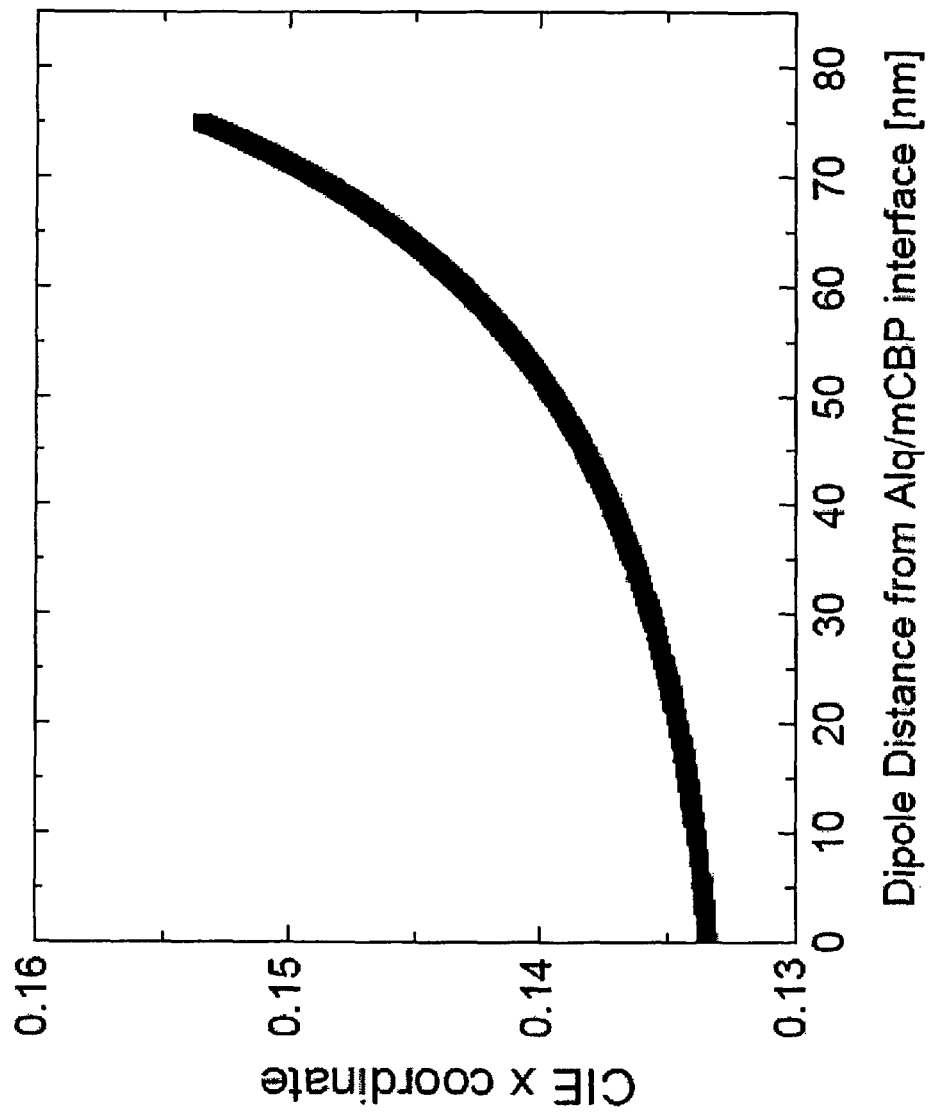
FIG. 18 shows a plot of measured CIE X coordinate versus dipole distance from the Alq/mCBP interface (nm) for the device of FIG. 17.
Figure 19:
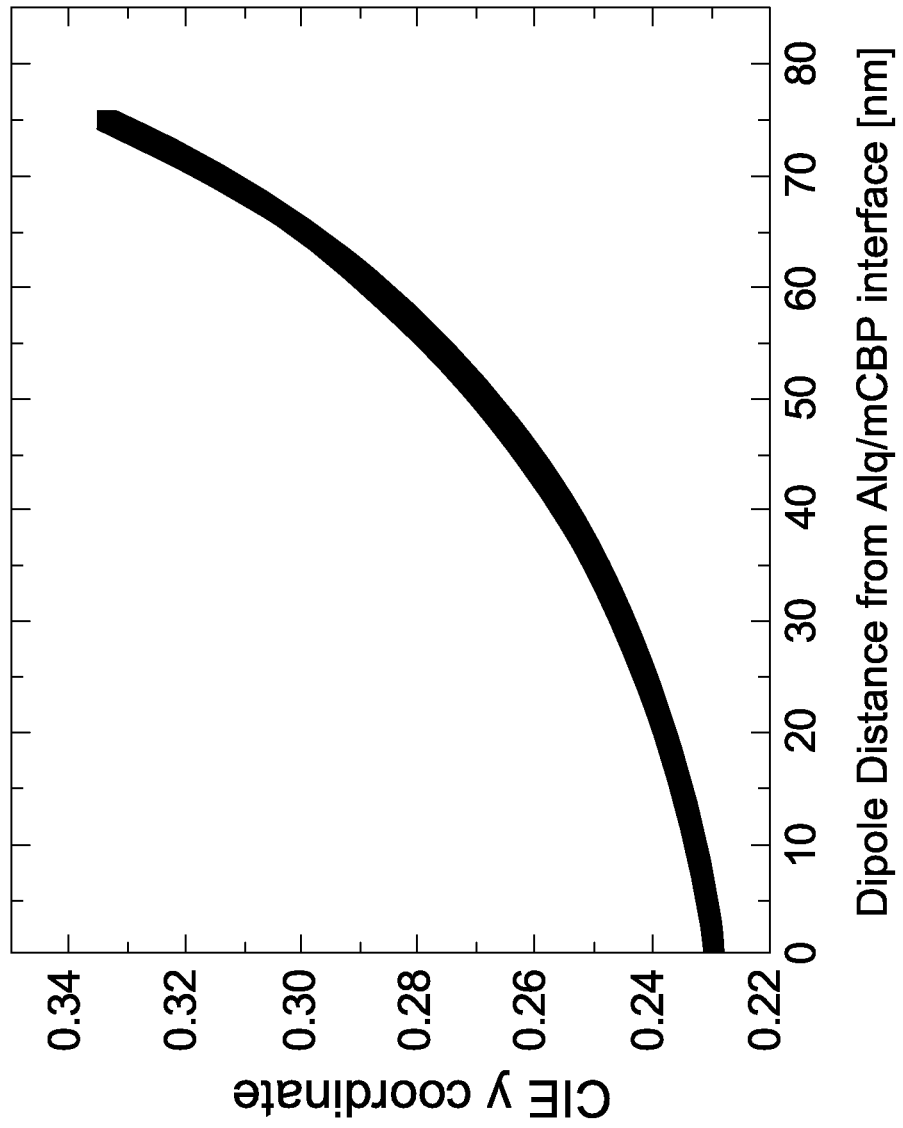
FIG. 19 shows a plot of measured CIE Y coordinate versus dipole distance from the Alq/mCBP interface (nm) for the device of FIG. 17.

FIG. 13 shows plots of measured normalized electroluminescent intensity versus wavelength for the device of FIG. 12 at various operating currents. A red shift is observed at the higher operating currents, as shown by the CIE coordinates in the legend of FIG. 13. The optical models shown in FIGS. 17-19 show red-shifting as the recombination position moves away from the cathode. It is therefore believed that the recombination position in the device of FIG. 12 shifts away from the cathode as higher currents are applied, as illustrated in FIG. 13.

Figure 26:
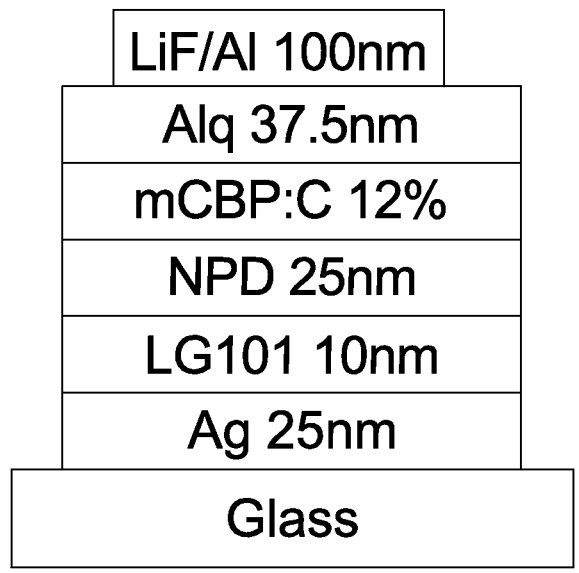
FIG. 26 shows a cross-sectional schematic of a device that includes a 25 nm thick Ag layer, which as a result has a microcavity.

FIG. 14 shows plots of measured electroluminescent intensity versus wavelength for the device of FIG. 12. The peak wavelength remains constant with increased viewing angle. The difference in peak wavelength between zero and sixty is below the resolution of the measuring equipment used, which is 2 nm. This is less than 0.5%. This result is surprisingly different from results typical for a device having a microcavity, where the peak wavelength generally shifts significantly with viewing angle, as can be seen in FIG. 26. The CIE coordinates also generally change in a device with a microcavity as the viewing angle increases.

Figure 15A:
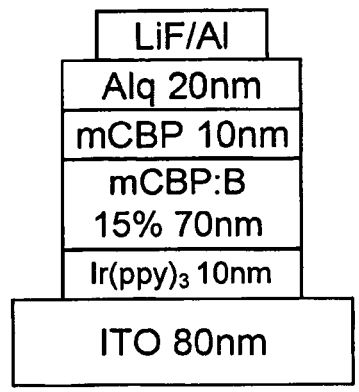
FIG. 15A shows a cross-sectional schematic of a device without a 5 nm thick Ag color saturation enhancement layer.
Figure 15B:
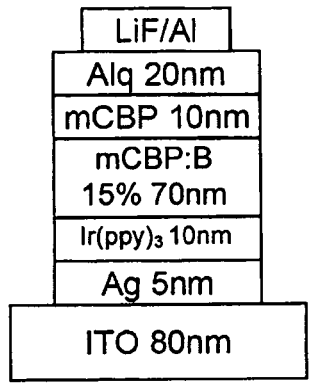
FIG. 15B shows a cross-sectional schematic of a device with a 5 nm thick Ag color saturation enhancement layer.
Figure 15C:
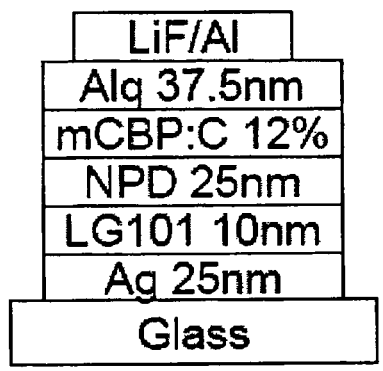
FIG. 15C shows a cross sectional schematic of a device with a 25 nm thick Ag layer, resulting in a microcavity.
Figure 16A:
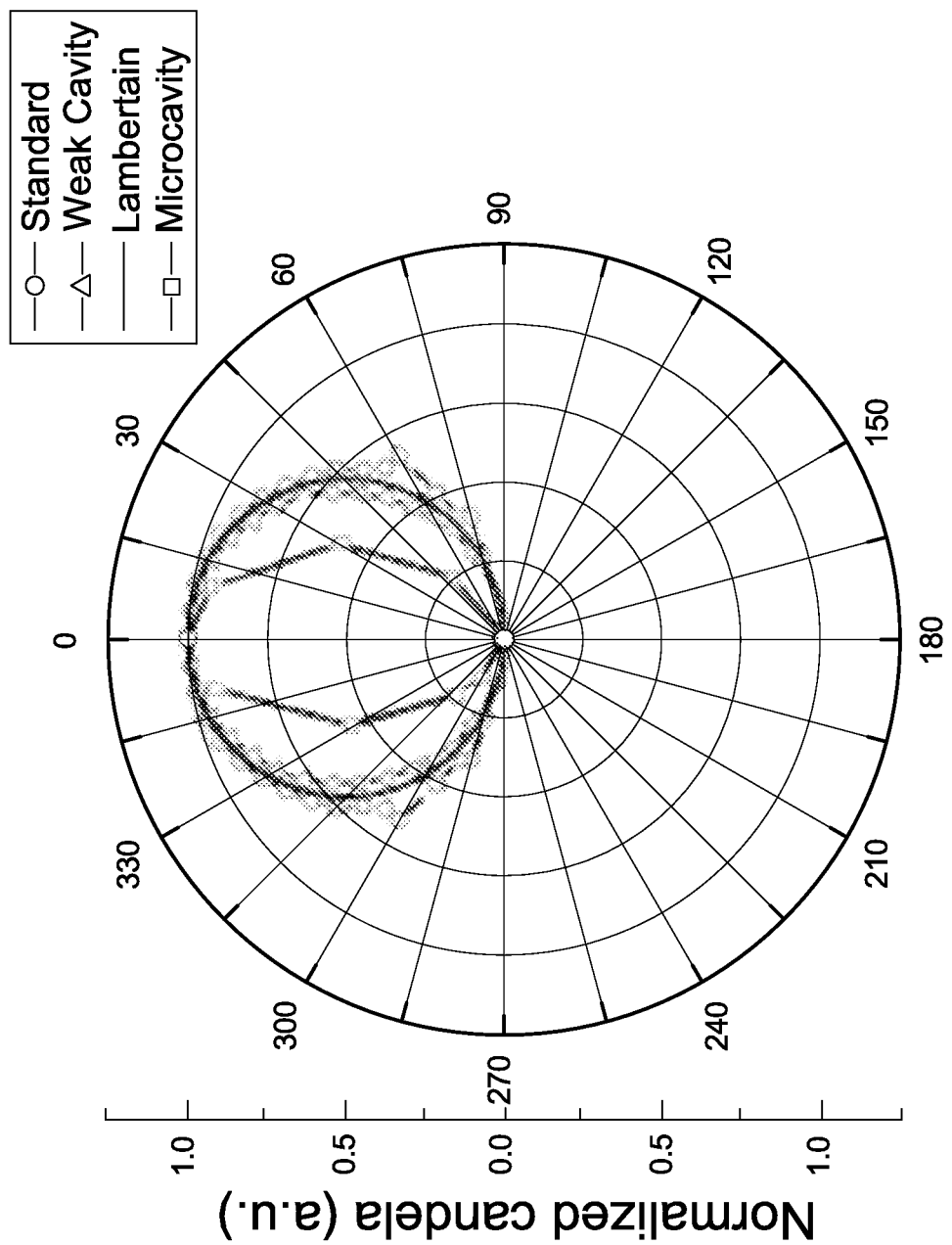
FIG. 16A shows measured emission intensity profiles.
Figure 16B:
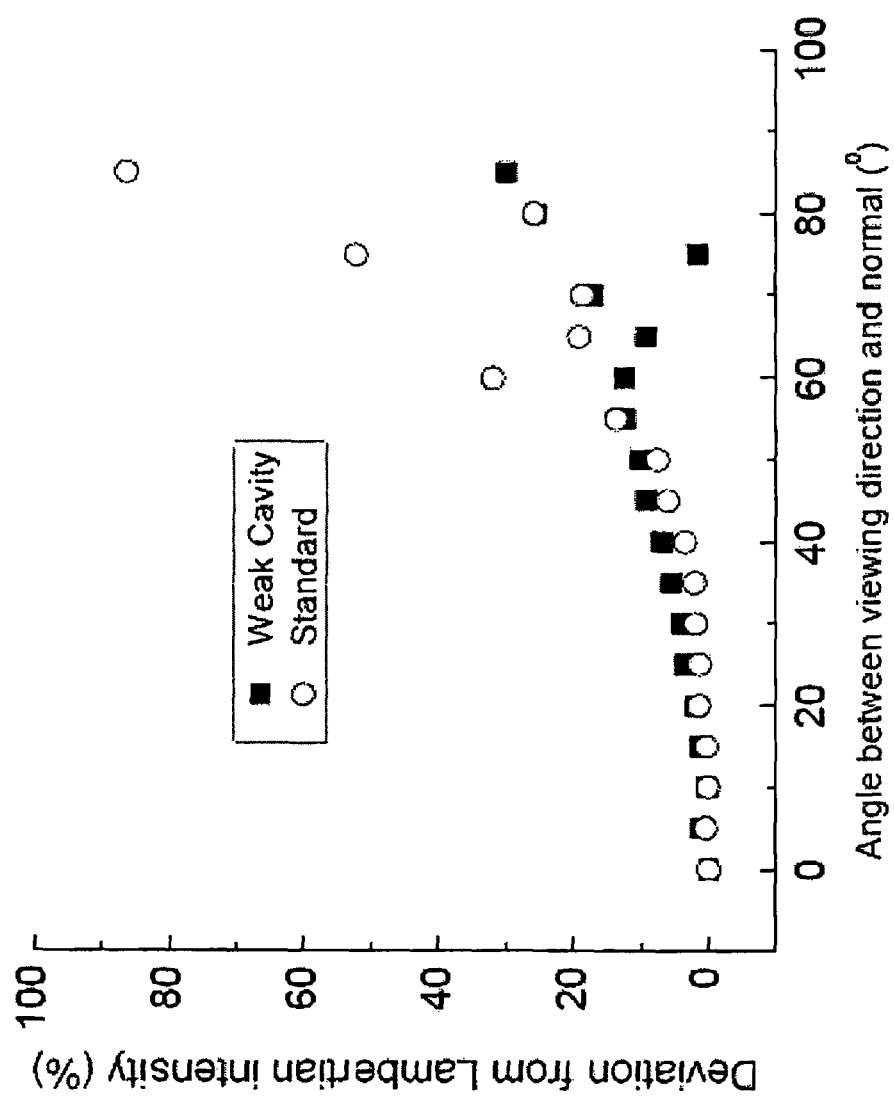
FIG. 16B shows measured plots of deviation from Lambertian emission versus viewing angle. The plot of Lambertian emission in FIG. 16A is calculated, and corresponds to the X-axis (zero deviation from Lambertian) in FIG. 16B.

FIG. 15 shows cross-sectional schematics of otherwise similar devices, with various thicknesses of silver over the anode. FIG. 15A shows a cross-sectional schematic of a device without a 5 nm thick Ag color saturation enhancement layer. The device of FIG. 15A includes a 80 nm thick anode of ITO, a 10 nm thick hole injection layer of Ir(ppy)3, a 70 nm thick emissive layer of mCBP doped with 15% of Compound B, a 10 nm thick hole blocking layer of mCBP, a 20 nm thick electron transport layer of Alq, and a LiF/Al cathode. The device of FIG. 15B is similar to that of FIG. 15A, but having an additional layer—a 5 nm thick Ag color saturation enhancement layer between the anode and the hole injection layer. The device of FIG. 15C is similar to that of FIG. 15B, but the layer of Ag is 25 nm thick instead of 5 nm thick—too thick for a color saturation enhancement layer. The device of FIG. 15C also uses LG101 instead of Ir(ppy)3 for the hole injection layer, and Compound C as the emissive molecule. While the use of a different hole injection layer may affect some device properties, the particular substitution made here is not expected to affect the normalized variation with angle of the intensity of light emitted by the device, which is what the devices of FIG. 15 were used to measure, because LG101 and Ir(ppy)3 have similar indices of refraction at the wavelengths of interest in these Figures.

FIG. 16 shows measured emission intensity profiles and measured plots of deviation from Lambertian emission versus viewing angle for the devices of FIG. 15. FIG. 16A shows measured emission intensity profiles. FIG. 16B shows measured plots of deviation from Lambertian emission versus viewing angle. The plot of Lambertian emission in FIG. 16A is calculated, and corresponds to the X-axis (zero deviation from Lambertian) in FIG. 16B. The device of FIG. 15A is described as "standard" in the plots of FIGS. 16A and 16B. The device of FIG. 15B, having a color saturation enhancement layer, is described as "weak cavity" in FIGS. 16A and 16B. The device of FIG. 15C, having a thick Ag layer, is described as "microcavity" in FIG. 16A.

FIG. 17 shows a cross-sectional schematic of a device that includes a 10 nm thick Ag color saturation enhancement layer. The device of FIG. 12 includes a 80 nm thick anode of ITO, a 10 nm thick color saturation enhancement layer of Ag, a 10 nm thick hole injection layer of Ir(ppy)3, a 75 nm thick emissive layer of mCBP, a 10 nm thick electron transport layer of Alq, and an Al cathode. The device of FIG. 17 was not actually fabricated. Rather, the optical properties of the various materials, and the thicknesses of the layers, were used to model the results shown in FIGS. 18 through 20. The EFTOS program was used for optical modeling. The emission spectra of Compound A was used for the modeling.

FIG. 18 shows a plot of measured CIE X coordinate versus dipole distance from the Alq/mCBP interface (nm) for the device of FIG. 17.

FIG. 19 shows a plot of measured CIE Y coordinate versus dipole distance from the Alq/mCBP interface (nm) for the device of FIG. 17. FIGS. 18 and 19 show that the CIE coordinates of light emitted from the device increases as the radiative dipoles, i.e., the recombination location, moves away from the Al cathode. FIGS. 18 and 19 show a blue shift as recombination moves towards the cathode. Thus, a color saturation enhancement layer that enhances hole injection may also be used to shift recombination towards the cathode and blue shift the emission spectrum of the device.

Figure 20:
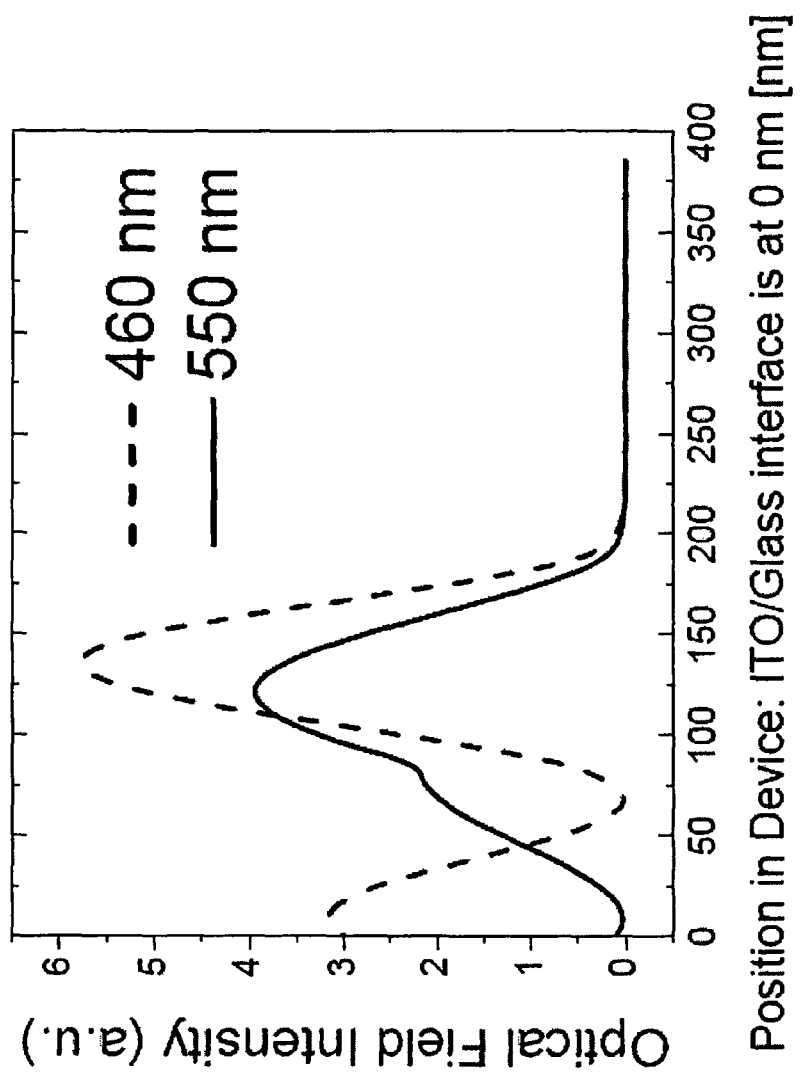
FIG. 20 shows plots of measured optical field intensity versus position in device for different wavelengths for the device of FIG. 17.

FIG. 20 shows plots of measured optical field intensity versus position in device for different wavelengths for the device of FIG. 17. At positions in the device corresponding to the emissive layer, i.e., at 100-175 nm, the optical electric field intensity for a wavelength of 460 nm (blue) is greater than the optical electric field intensity for certain higher wavelengths, such as 550 nm, such that radiative transitions of blue photons are enhanced. Typical blue emitters have spectra with tails that extend to 550 nm, so the optical field strength in the range 460-550 nm is significant.

Figure 21:
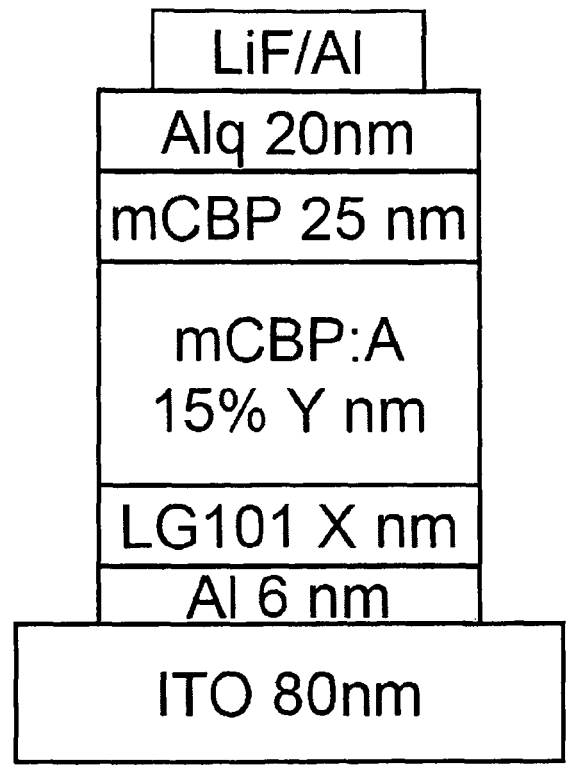
FIG. 21 shows a cross-sectional schematic of a device that includes a 6 nm thick Al color saturation enhancement layer.

FIG. 21 shows a cross-sectional schematic of a device that includes a 6 nm thick Al color saturation enhancement layer. The device of FIG. 21 includes a 80 nm thick anode of ITO, a 6 nm thick color saturation enhancement layer of Al, a hole injection layer of LG101 having a variable thickness X, an emissive layer of mCBP doped with 15% of compound B having a variable thickness Y, a 25 nm thick hole blocking layer of mCBP, a 20 nm thick electron transport layer of Alq, and an LiF/Al cathode. The variable thicknesses for the device shown in FIG. 21 are provided in the legend for FIG. 25. Three devices were fabricated, having constant total thickness. The first device had X=30 nm and Y=30 nm, the second had X=20 nm and Y=40 nm, and the third had X=10 nm and Y=50 nm.

Figure 22:
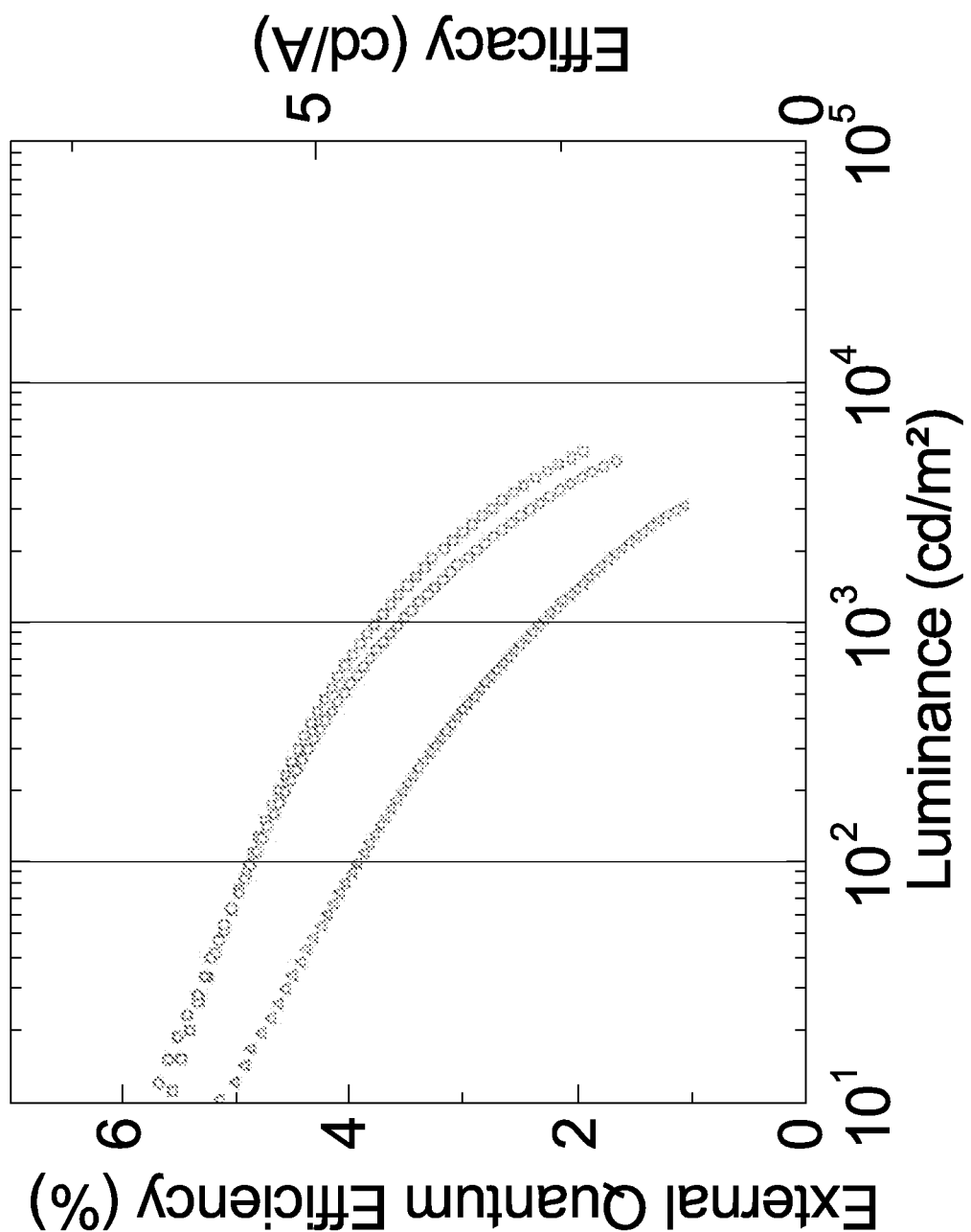
FIG. 22 shows plots of measured external quantum efficiency versus luminance for the device of FIG. 21 with various thicknesses for some of the layers in the device.

FIG. 22 shows plots of measured external quantum efficiency versus luminance for the device of FIG. 21 with various thicknesses for some of the layers in the device. FIG. 22 shows that the devices having a thicker hole injection layer and a thinner emissive layer have higher external quantum efficiencies for a given luminance.

Figure 23:
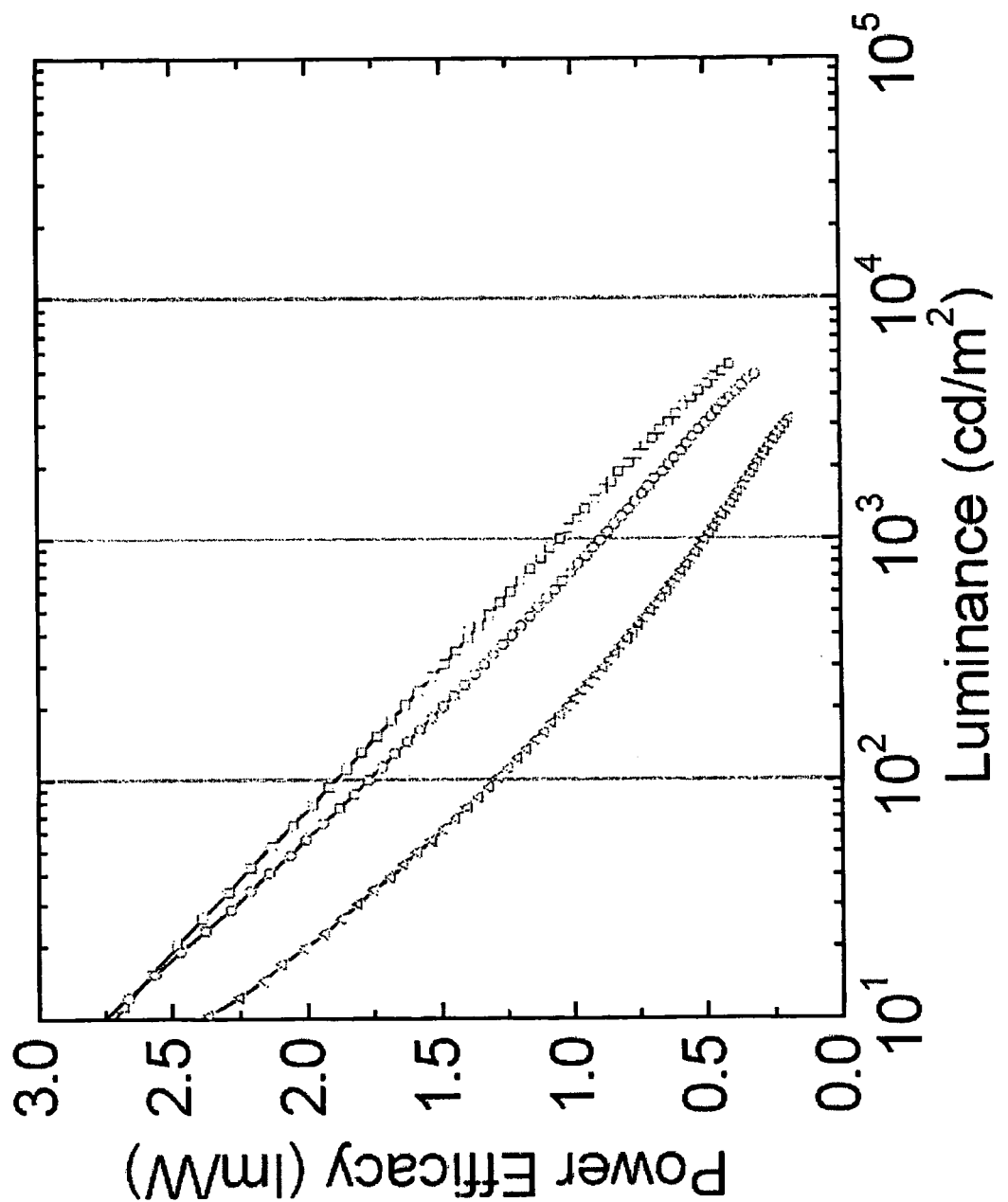
FIG. 23 shows plots of measured power efficacy versus luminance for the device of FIG. 21 with various thicknesses for some of the layers in the device.

FIG. 23 shows plots of measured power efficacy versus luminance for the device of FIG. 21 with various thicknesses for some of the layers in the device. FIG. 23 shows that the devices having a thicker hole injection layer and a thinner emissive layer have higher power efficacies for a given luminance.

Figure 24:
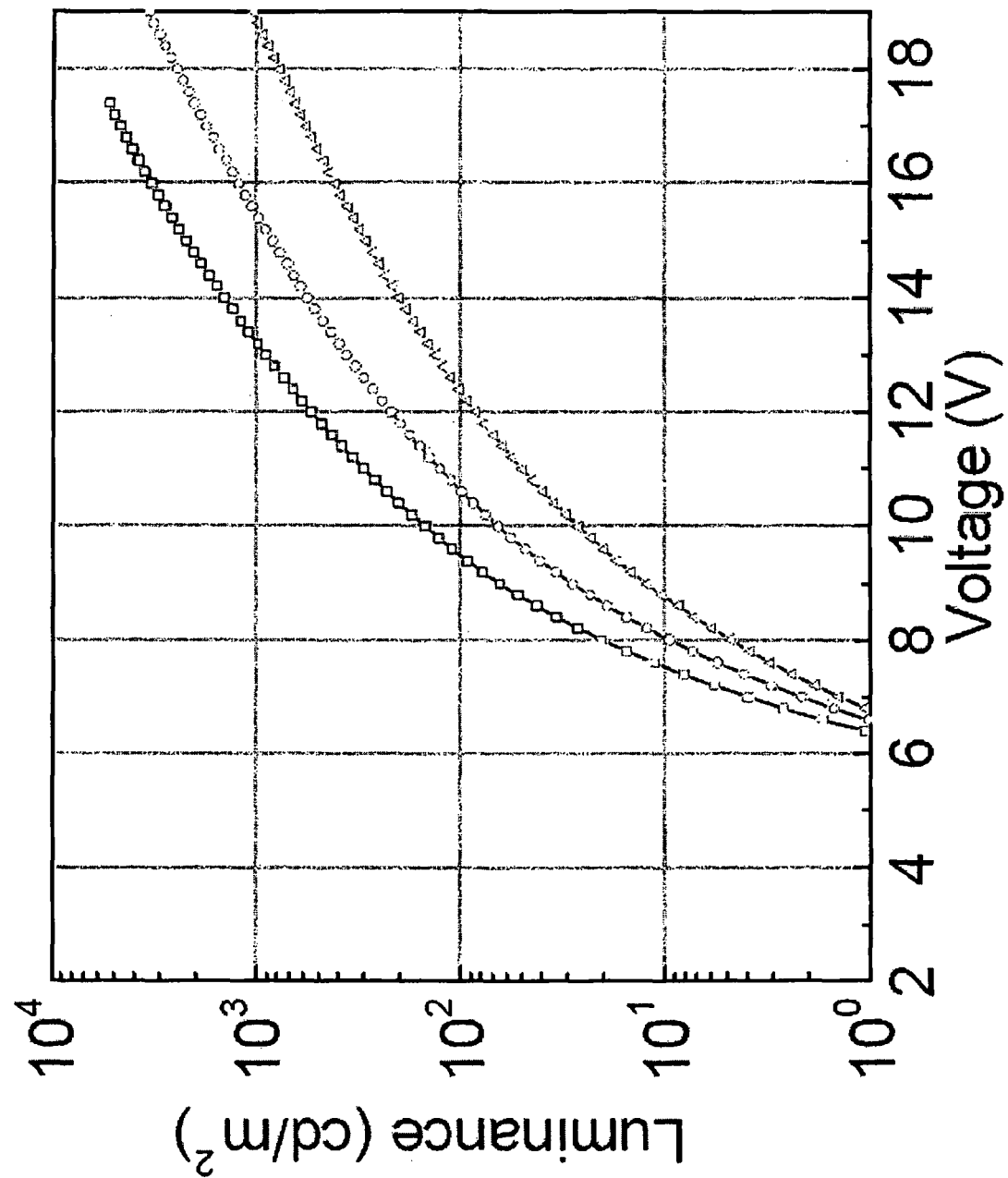
FIG. 24 shows plots of measured luminance versus voltage for the device of FIG. 21 with various thicknesses for some of the layers in the device.

FIG. 24 shows plots of measured luminance versus voltage for the device of FIG. 21 with various thicknesses for some of the layers in the device. FIG. 24 shows that the devices having a thicker hole injection layer and a thinner emissive layer have higher luminances for a given voltage.

Figure 25:
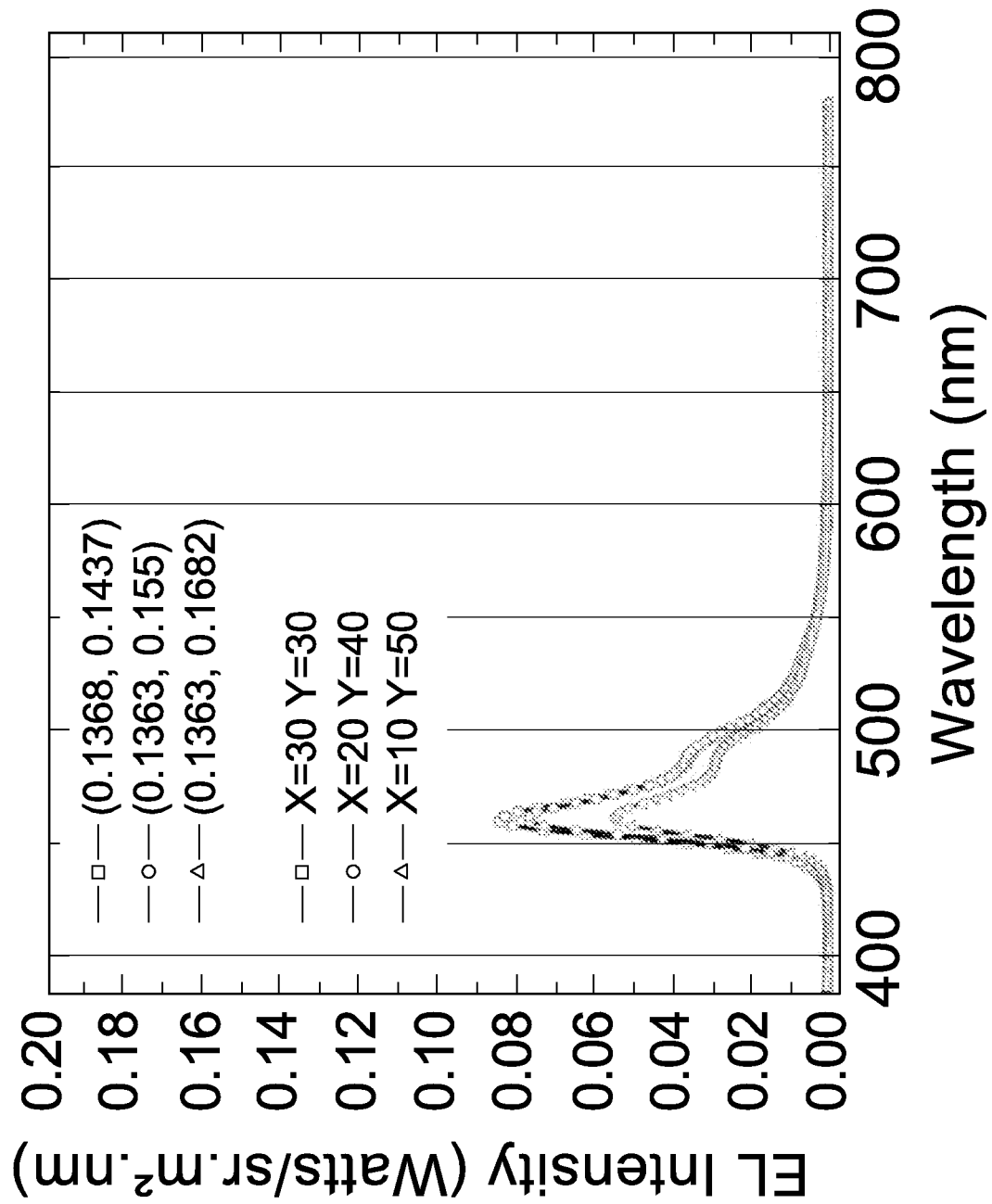
FIG. 25 shows plots of measured electroluminescent intensity versus wavelength (emission spectra) for the device of FIG. 21 with various thicknesses for some of the layers in the device.

FIG. 25 shows plots of measured electroluminescent intensity versus wavelength (emission spectra) for the device of FIG. 21 with various thicknesses for some of the layers in the device. CIE coordinates for the three devices are also provided in the legend. The electroluminescent spectra in FIG. 25 show that the CIE y-coordinate changes when the location of the recombination zone was shifted within device structures that had the same overall thickness. Bluer CIE is obtained when the distance from the cathode to the recombination zone is decreased. In configurations where the color saturation enhancement layer is disposed on an anode, the color saturation enhancement layer may enhance hole injection and cause the recombination zone to shift towards the cathode. This may result in a blue shift of the light emitted by the device in addition to that caused by the reflectivity of the color saturation enhancement layer.

FIG. 26 shows a cross-sectional schematic of a device that includes a 25 nm thick Ag layer, which as a result has a microcavity. The device of FIG. 26 includes a 25 nm thick anode of Ag, a 10 nm thick hole injection layer of LG101, a 25 nm thick hole transport layer of NPD, an emissive layer of mCBP doped with 12% of compound C, a 37.5 nm thick electron transport layer of Alq, and an LiF/Al cathode.

FIG. 26 shows plots of measured electroluminescent intensity versus wavelength for the device of FIG. 26 measured at various viewing angles. FIG. 26 shows that the peak wavelength shifts from 464 nm at a viewing angle of zero degrees to 456 nm at a viewing angle of 50 degrees.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. An organic light emitting device, comprising:
a first electrode comprising a transparent metallic oxide;
a second electrode;
at least one organic layer disposed between the first electrode and the second electrode, the at least one organic layer including an emissive layer, wherein the emissive layer includes an emissive material with an intrinsic emission spectrum having a peak emission wavelength in the visible spectrum less than 500 nm; and
a color saturation enhancement layer disposed between the first electrode and the second electrode and in direct contact with the first electrode, wherein the color saturation enhancement layer consists essentially of one or more metals or conductive doped inorganic semiconductors;
wherein the color enhancement saturation layer has an index of refraction at least 0.2 different from that of the at least one organic layer and is in direct contact with the at least one organic layer;
wherein the color saturation enhancement layer has a thickness of 1-10 nm; and
wherein the reflectivity of the color saturation enhancement layer is in the range 5% to 30% for the peak wavelength in the intrinsic emission spectrum of the emissive material.

2. The device of claim 1 wherein the first electrode is an anode and the second electrode is a cathode.

3. The device of claim 1 wherein the color enhancement saturation layer consists essentially of silver.

4. The device of claim 1 wherein the color enhancement saturation layer consists essentially of chromium.

5. The device of claim 1 wherein the color enhancement saturation layer consists essentially of aluminum.

6. The device of claim 1 wherein the color enhancement saturation layer consists essentially of cobalt.

7. The device of claim 1, wherein the second electrode comprises a transparent conductive oxide.

8. The device of claim 7, wherein the second electrode comprises indium tin oxide.

9. The device of claim 1, wherein the device has an emission spectrum with a full width half maximum that is at least 5 nm less than that of an otherwise identical device without a color saturation enhancement layer.

10. The device of claim 1, wherein the device has an emission spectrum with a full width half maximum that is at least 10 nm less than that of an otherwise identical device without a color saturation enhancement layer.

11. The device of claim 1, wherein the device has an emission spectrum with a full width half maximum that is at least 12 nm less than that of an otherwise identical device without a color saturation enhancement layer.

12. The device of claim 1, wherein the peak wavelength of the light emitted by the device at all angles between zero and sixty degrees does not deviate by more than 1.5% from the peak wavelength emitted at an angle of zero degrees.

13. The device of claim 1, wherein the peak wavelength of the light emitted by the device at all angles between zero and sixty degrees does not deviate by more than 1.0% from the peak wavelength emitted at an angle of zero degrees.

14. The device of claim 1, wherein the peak wavelength of the light emitted by the device at all angles between zero and sixty degrees does not deviate by more than 0.5% from the peak wavelength emitted at an angle of zero degrees.

15. The device of claim 9, wherein the peak wavelength of the light emitted by the device at all angles between zero and sixty degrees does not deviate by more than 1.5% from the peak wavelength emitted at an angle of zero degrees.

16. The device of claim 1, wherein the CIE coordinate of the light emitted by the emissive layer observed at an angle of zero is not more than 0.01, 0.03 different from the CIE coordinate of the emitted light at an angle of 60 degrees.

17. The device of claim 1, wherein the intensity of light emitted by the device is less than 20% different from Lambertian emission at all angles from zero to sixty degrees.

18. The device of claim 1, wherein the intensity of light emitted by the device is less than 15% different from Lambertian emission at all angles from zero to sixty degrees.

19. An organic light emitting device, comprising:
a first electrode comprising a transparent metallic oxide;
a second electrode;
an emissive layer disposed between the first electrode and the second electrode, wherein the emissive layer includes an emissive material with an intrinsic emission spectrum having a peak emission wavelength in the visible spectrum less than 500 nm; and
a color saturation enhancement layer in direct contact with the first electrode, wherein the color saturation enhancement layer consists essentially of one or more metals or conductive doped inorganic semiconductors;
wherein the color enhancement saturation layer has an index of refraction at least 0.2 different from that of the first electrode and is disposed between the first electrode and the second electrode and in direct contact with the emissive layer;
wherein the color saturation enhancement layer has a thickness of 1-10 nm; and
wherein the reflectivity of the color saturation enhancement layer is in the range 5% to 30% for the peak wavelength in the intrinsic emission spectrum of the emissive material.

* * * * *